United States Patent [19]

Tabuchi et al.

[11] Patent Number: 5,787,106
[45] Date of Patent: Jul. 28, 1998

[54] OPTICAL SEMICONDUCTOR DEVICE FOR CHANGING A BEAM DIAMETER

[75] Inventors: Haruhiko Tabuchi; Masumi Norizuki; Masami Goto, all of Kawasaki, Japan

[73] Assignee: Fujitsu Limited, Kanagawa, Japan

[21] Appl. No.: 613,208

[22] Filed: Mar. 8, 1996

[30] Foreign Application Priority Data

Jun. 2, 1995 [JP] Japan .................. 7-136933

[51] Int. Cl.$^6$ .................. H01S 3/19; H01S 3/08; G02B 6/10
[52] U.S. Cl. .................. 372/50; 372/46; 372/96; 385/131
[58] Field of Search .................. 372/50, 26, 96, 372/45; 385/131, 14

[56] References Cited

U.S. PATENT DOCUMENTS

| | | | |
|---|---|---|---|
| 4,740,987 | 4/1988 | McCall, Jr. et al. | 372/96 |
| 4,932,032 | 6/1990 | Koch et al. | 372/50 |
| 4,941,146 | 7/1990 | Kobayashi | 372/46 |
| 4,961,198 | 10/1990 | Ishino et al. | 372/50 |

FOREIGN PATENT DOCUMENTS 5-142435  6/1993  Japan .
7-66502  3/1995  Japan .

*Primary Examiner*—Rodney B. Bovernick
*Assistant Examiner*—Luong-Quyen T. Phan
*Attorney, Agent, or Firm*—Helfgott & Karas, P.C.

[57] ABSTRACT

An optical semiconductor device has a greatly reduced transmission constant even when a reduction rate in the thickness of a core layer is small so that a relatively high beam-diameter increasing efficiency is obtained. The optical semiconductor device has a multilayered structure with a first end surface perpendicular to an optical axis of the optical semiconductor device and a second end surface opposite to the first end surface. A core layer has a first refractive index. A lower cladding layer is provided on a lower side of the core layer, the lower cladding layer having a second refractive index. An upper cladding layer is provided on an upper side of the core layer, the upper cladding layer having the second refractive index. A transmission constant reduction enhancing layer is provided between the lower cladding layer and the upper cladding layer, the transmission constant reduction enhancing layer having a third refractive index less than the first refractive index and the second refractive index. The optical semiconductor device includes a first area and a second area, a portion of the core layer in the first area having a uniform thickness, a portion of the core layer in the second area having a thickness gradually decreasing toward the first end surface of the optical semiconductor device.

29 Claims, 37 Drawing Sheets

FIG. 3A PRIOR ART
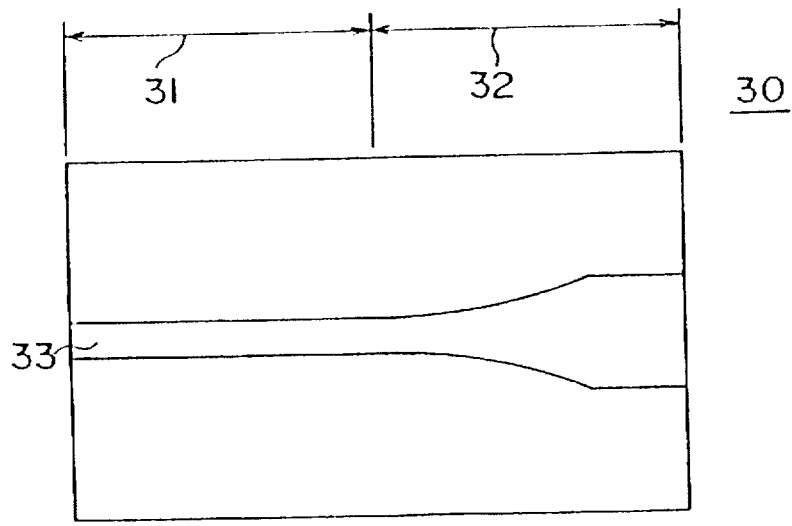
FIG. 3B PRIOR ART
FIG. 3C PRIOR ART
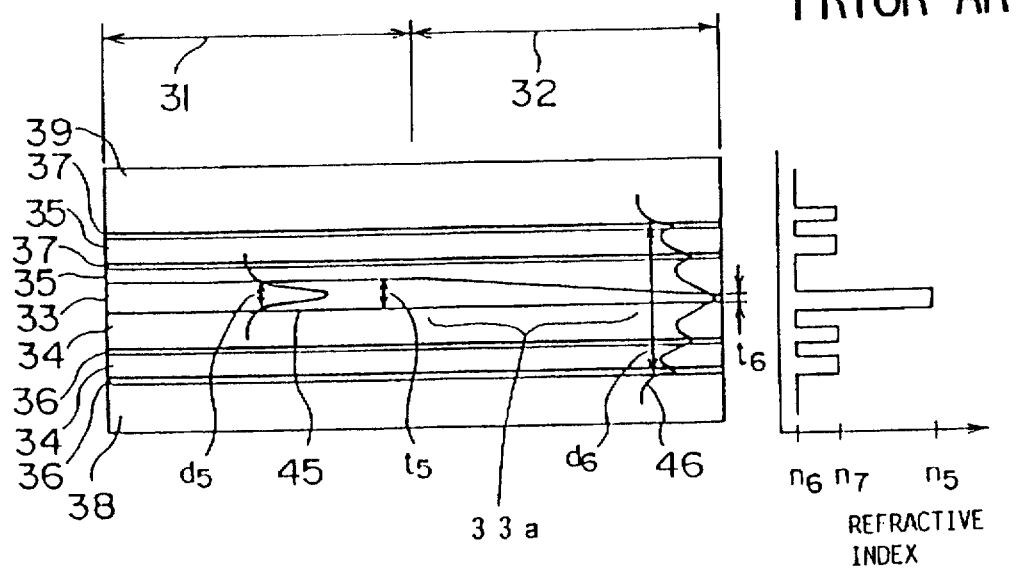

$n_{12} < n_{11} < n_{10}$
$t_{11} = 0.7 \times t_{10}$
$t_{12} = t_{13} = 0.7 \mu m$

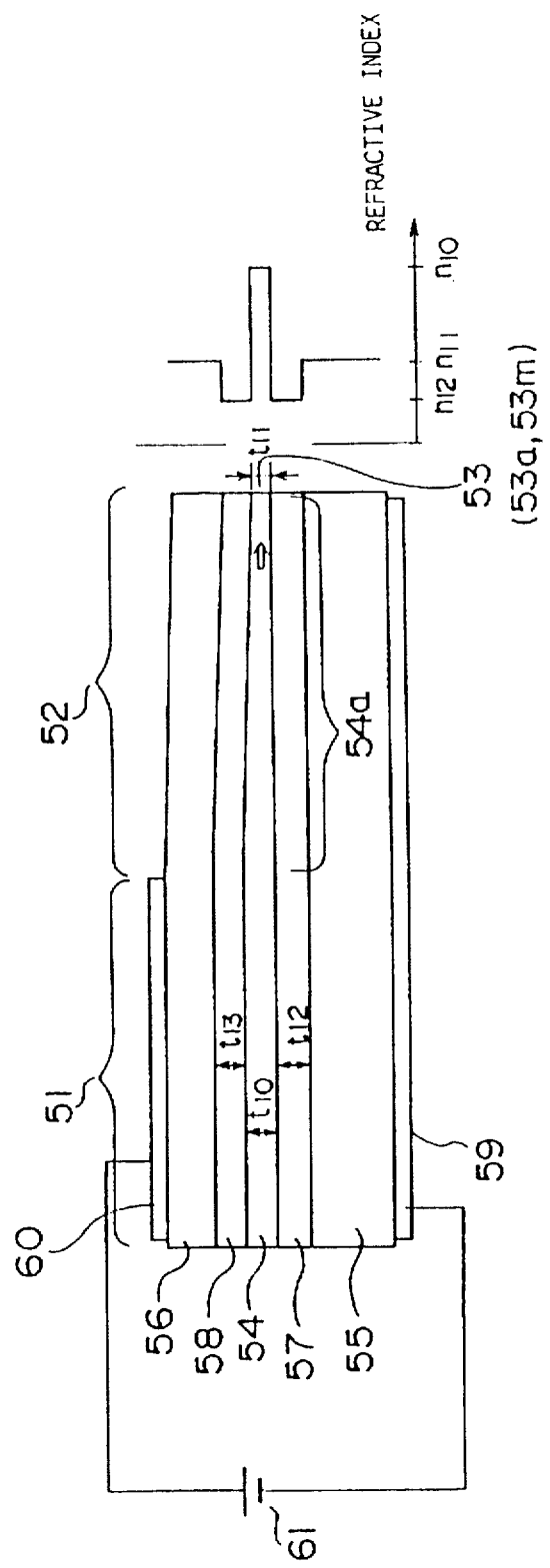

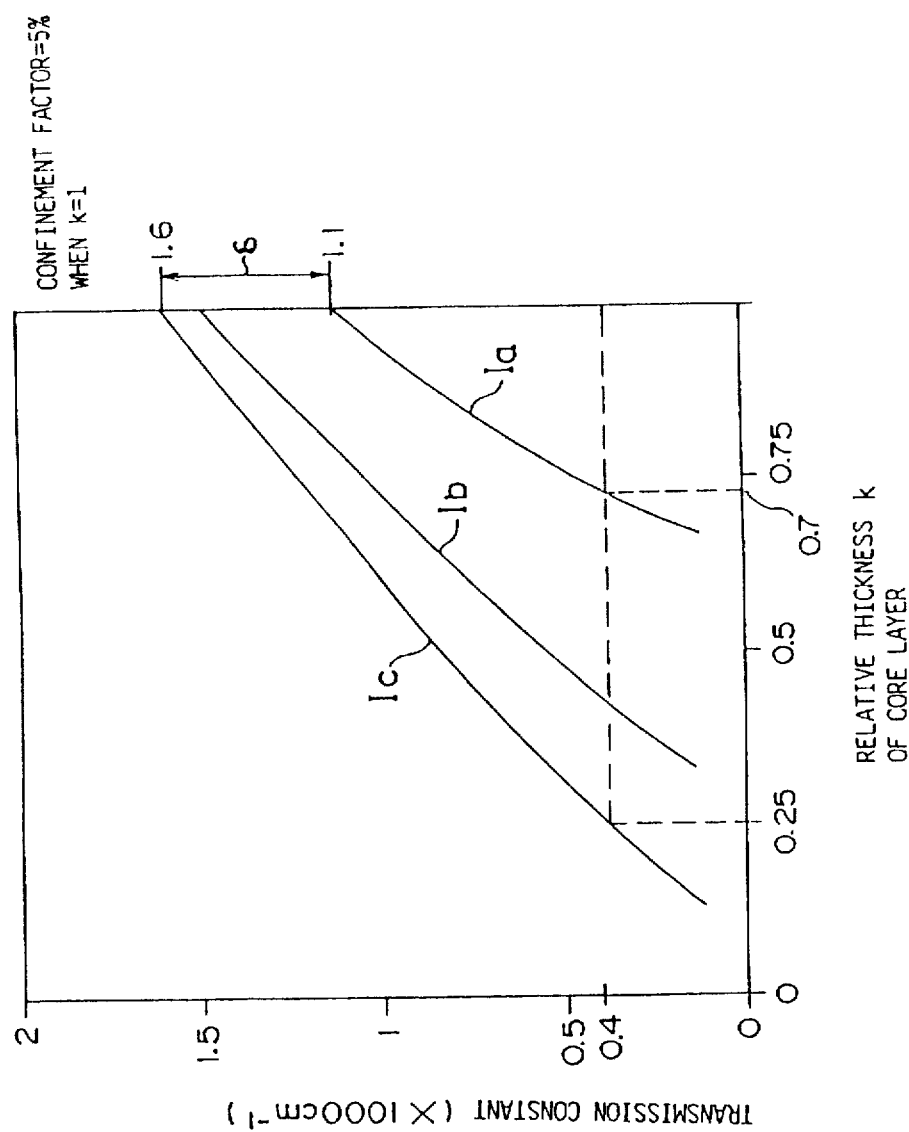

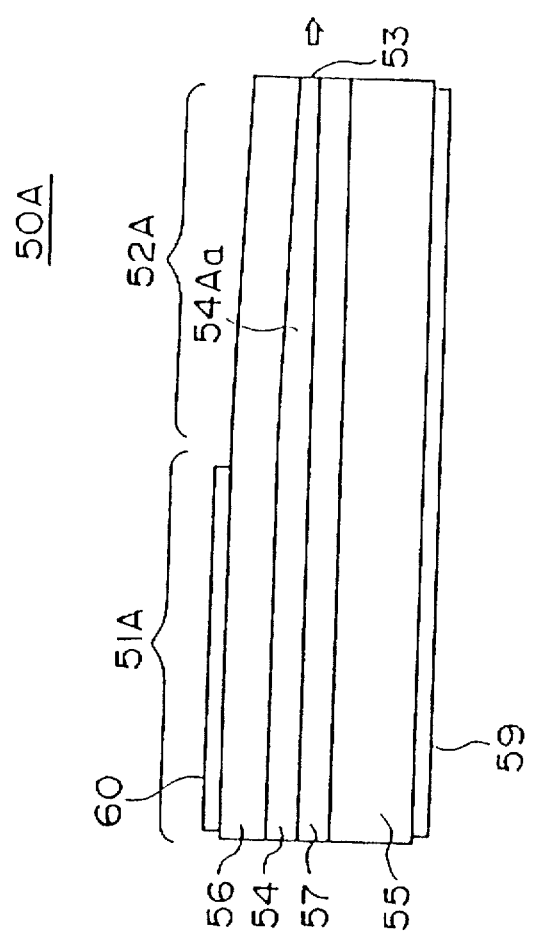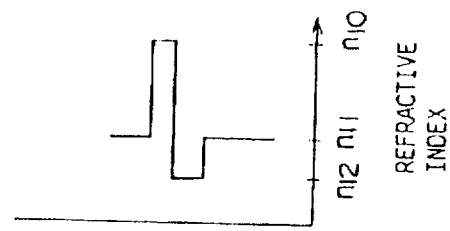
FIG. 13A
FIG. 13B

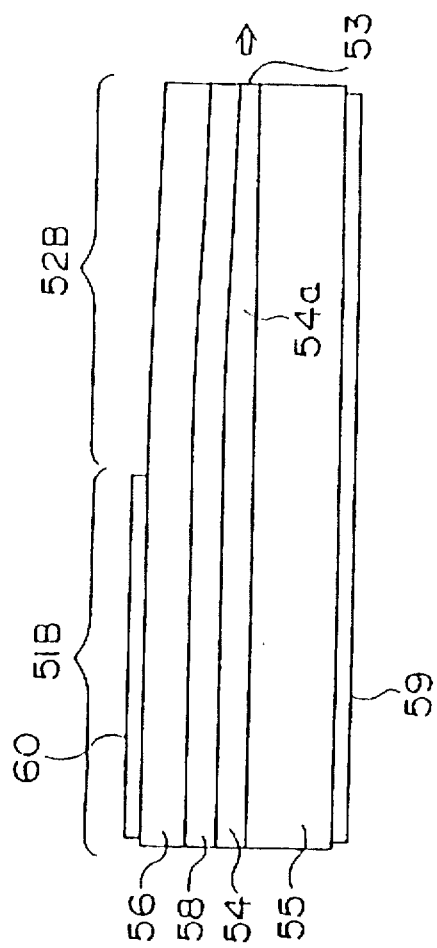

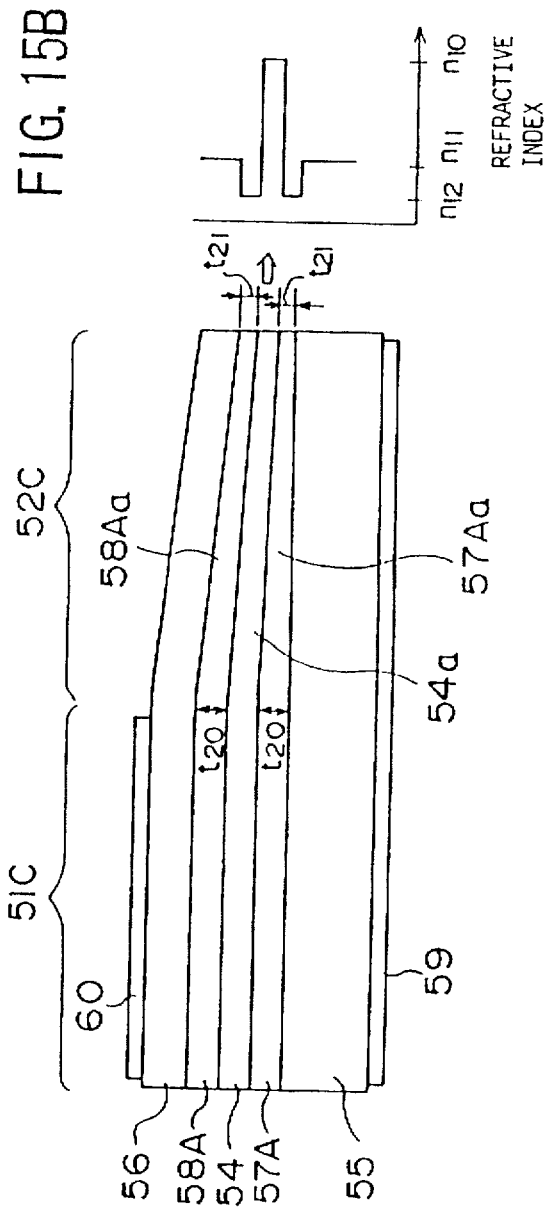

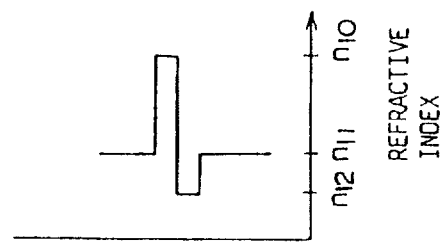
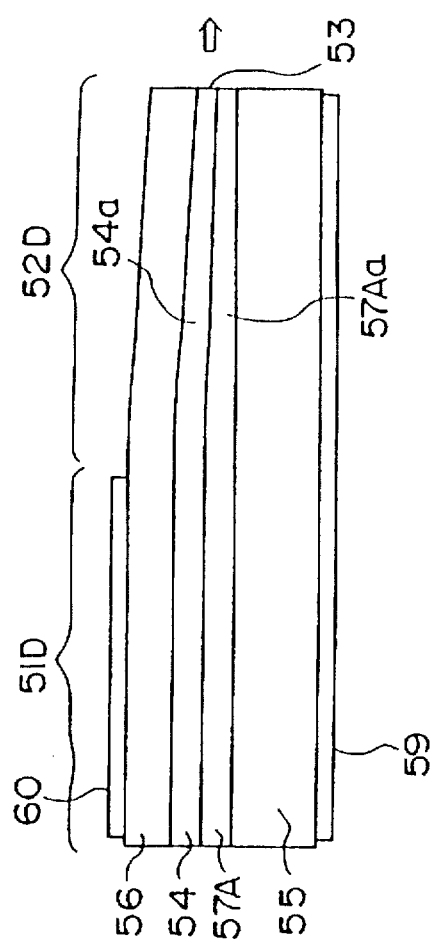

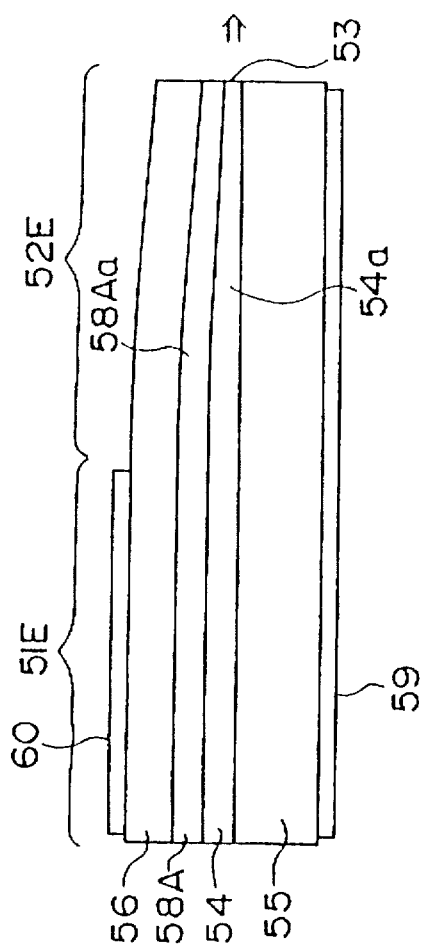

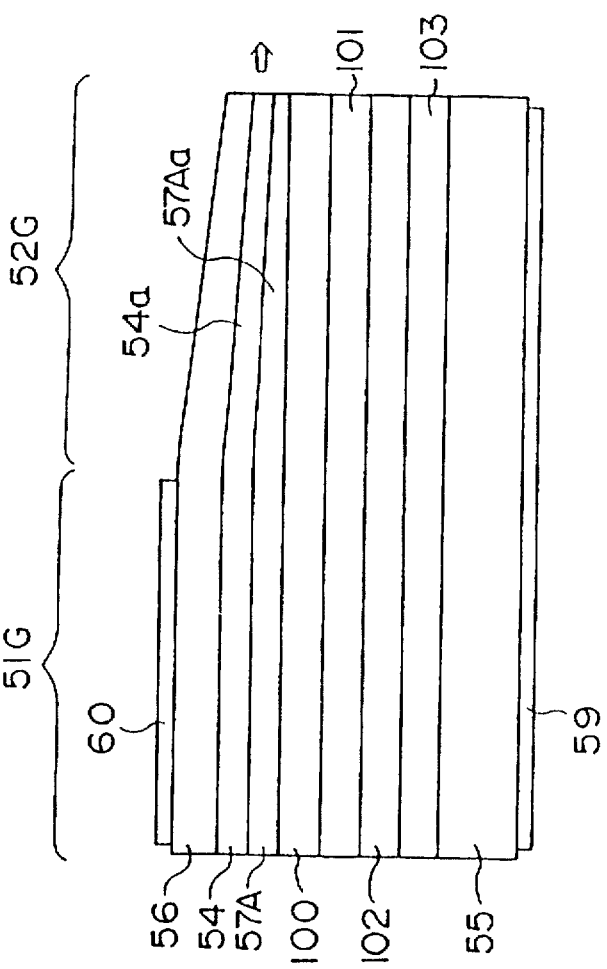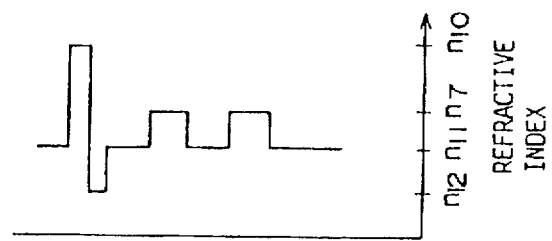
FIG. 22A
FIG. 22B

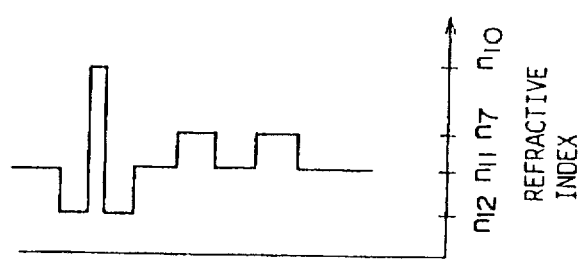
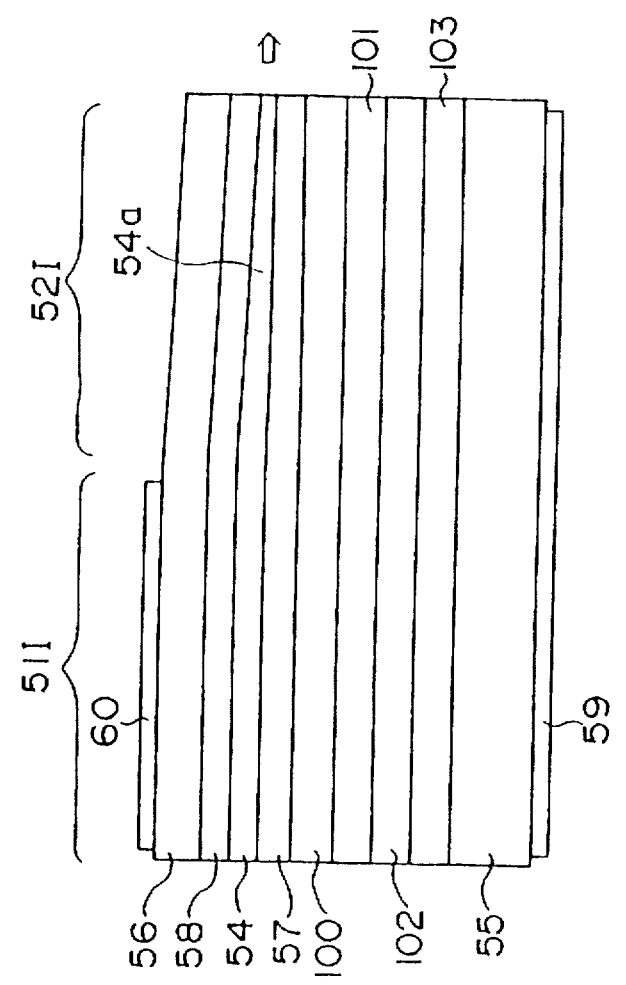

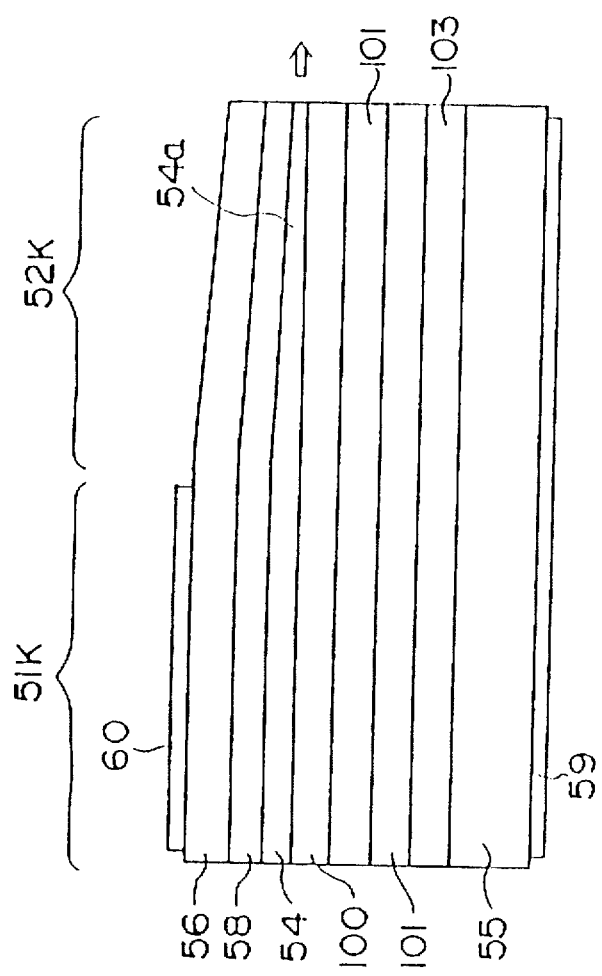
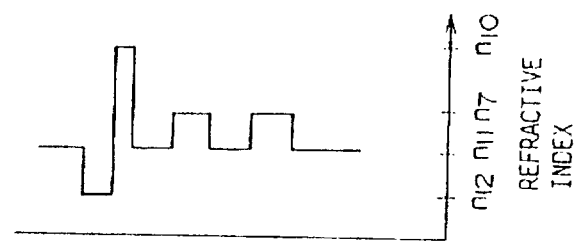
FIG. 27A
FIG. 27B

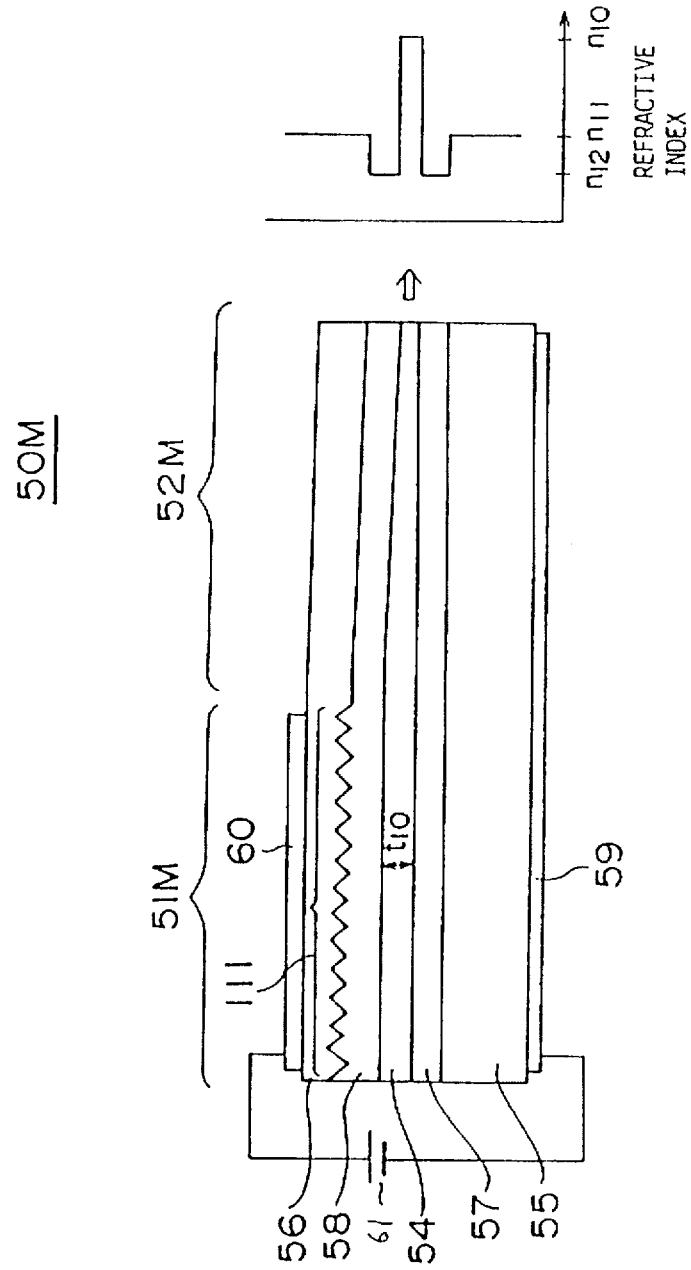

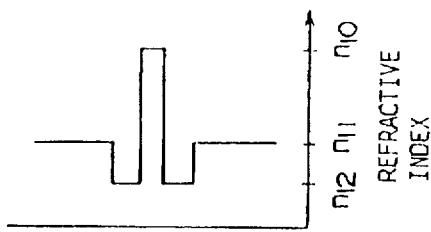
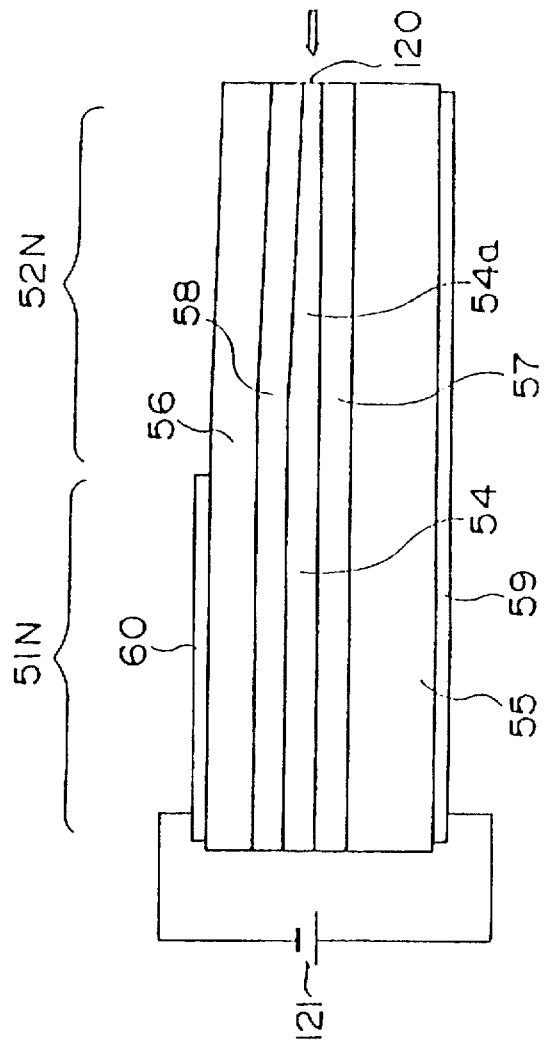

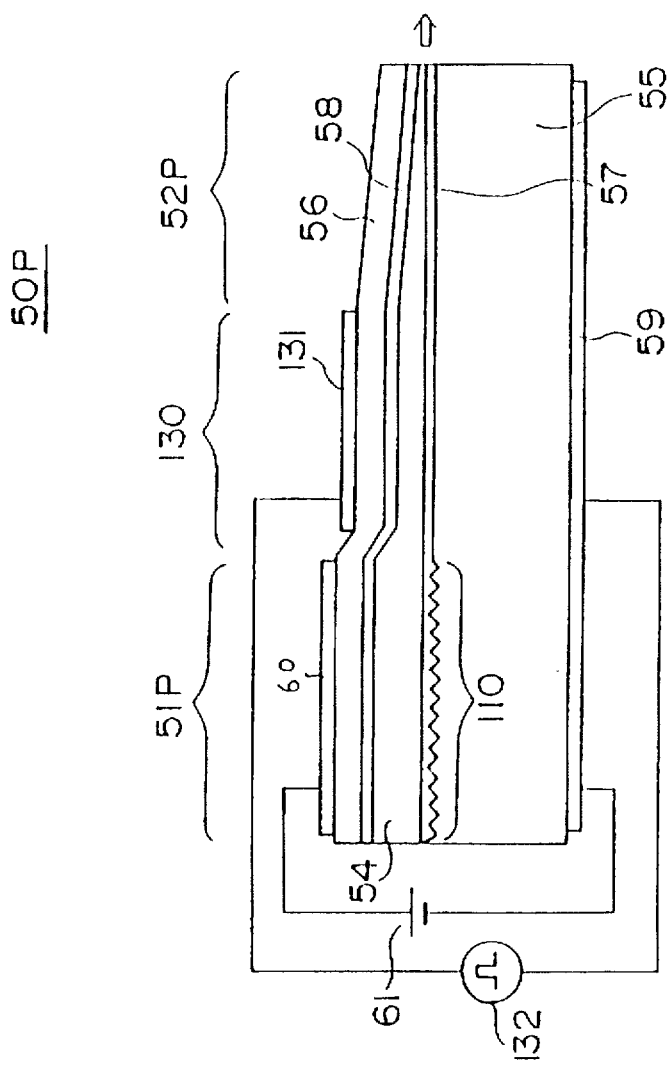
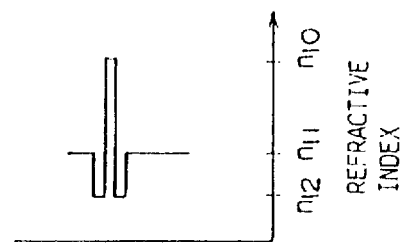
FIG. 31A
FIG. 31B

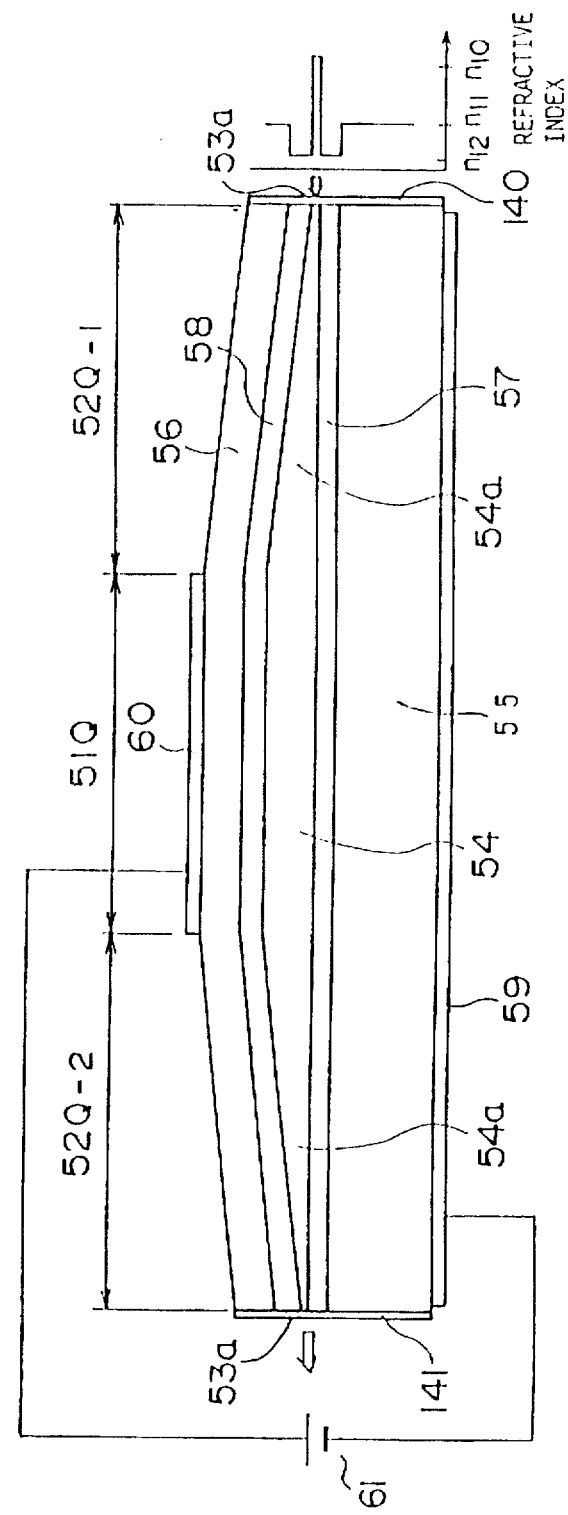

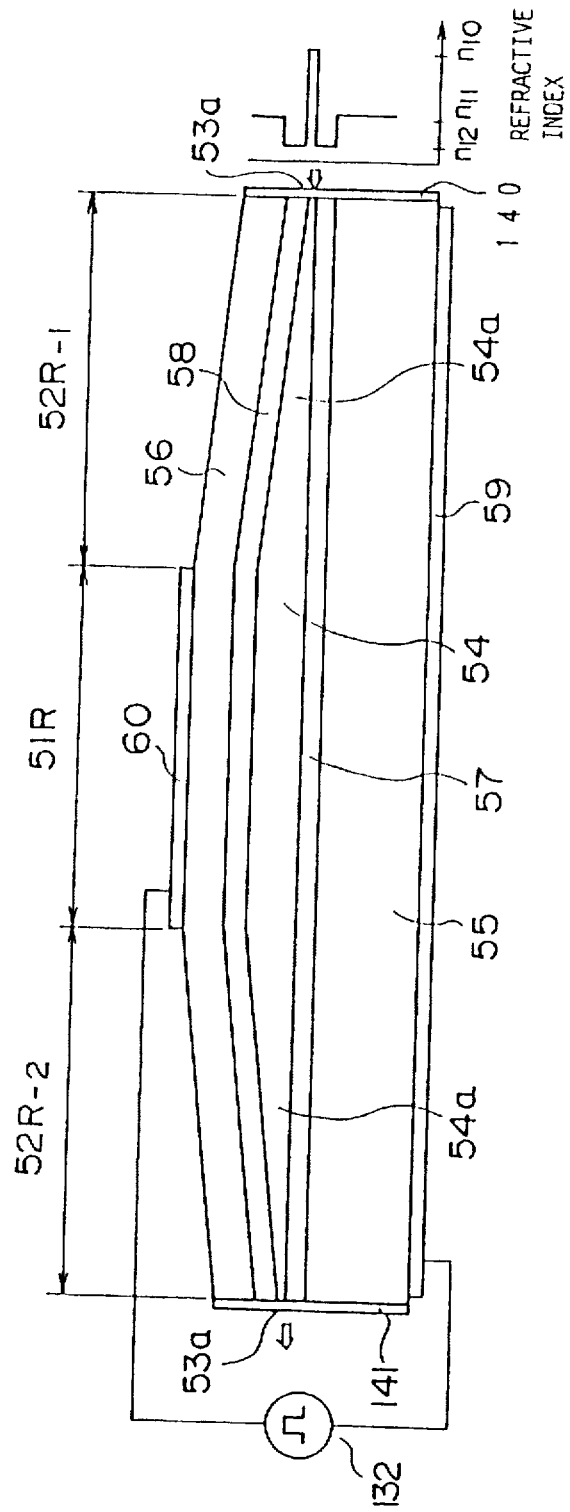

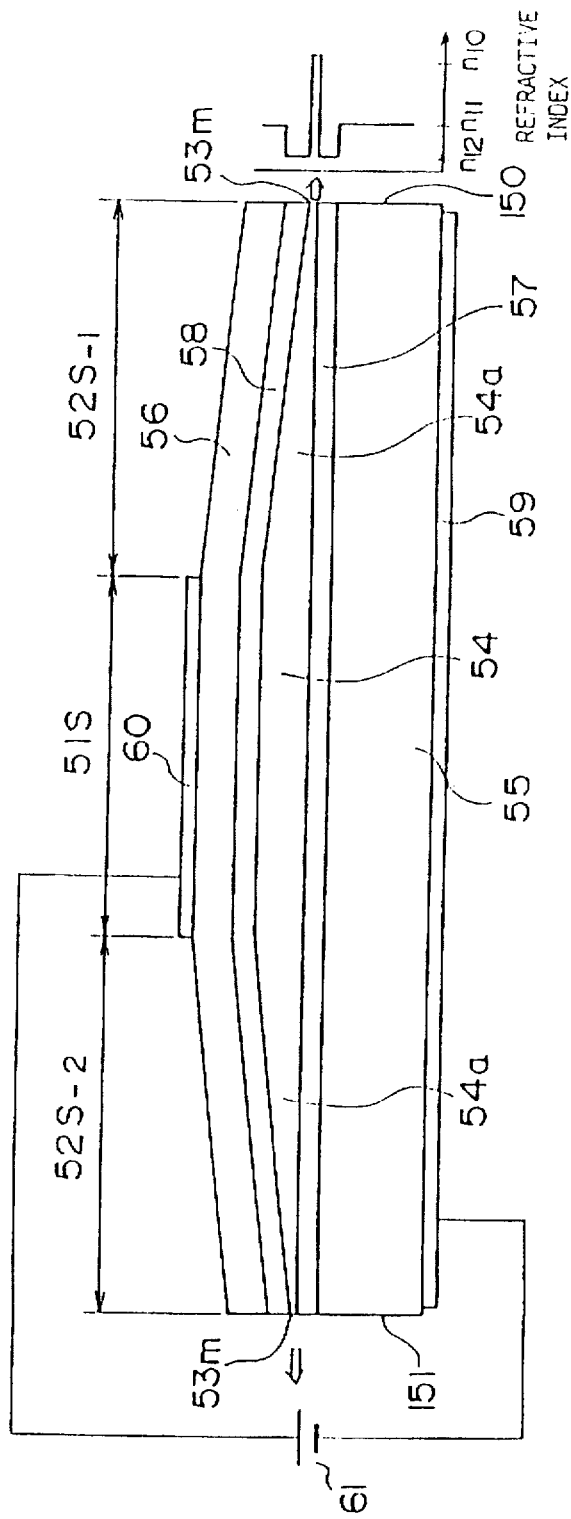

FIG. 35A
FIG. 35B
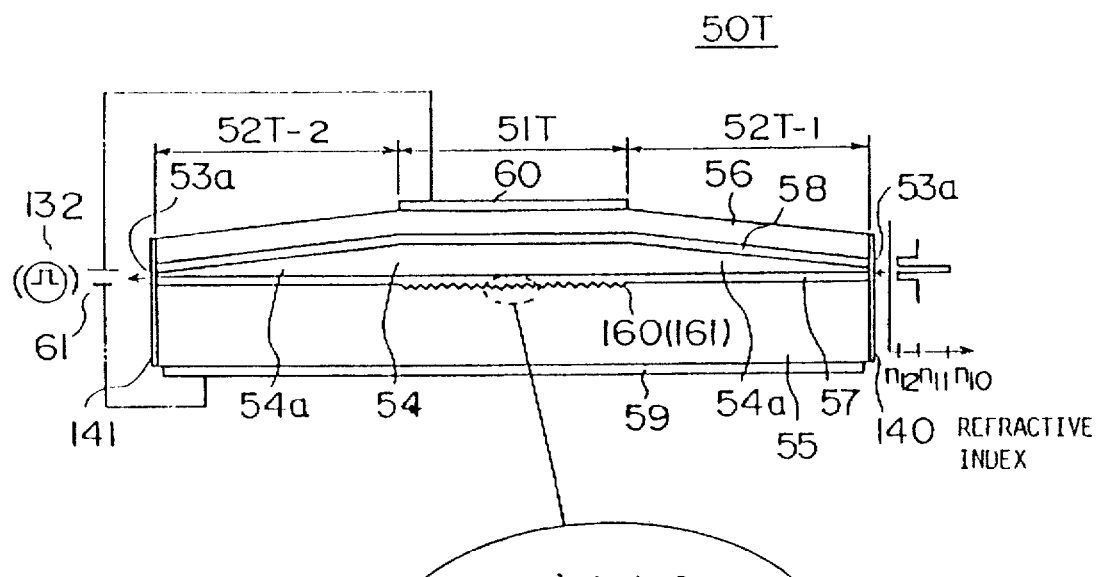
FIG. 35C
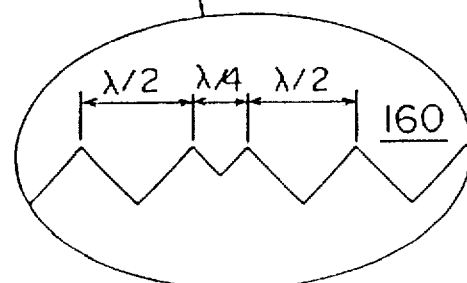
FIG. 35D
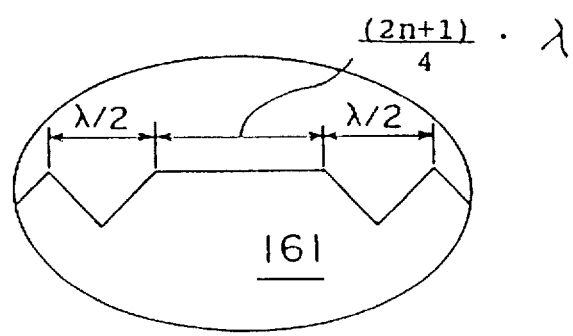

OPTICAL SEMICONDUCTOR DEVICE FOR CHANGING A BEAM DIAMETER

BACKGROUND OF THE INVENTION

1. Field of the Invention

The present invention generally relates to an optical semiconductor device and, more particularly, to an optical semiconductor device having a waveguide path for changing a diameter of a light beam.

An optical communication system is composed of parts such as a semiconductor laser, an optical fiber, a photodiode, etc. In order to improve a performance of the optical communication system, it is desired that the semiconductor laser has an improved light-emitting efficiency and optical coupling efficiency with optical fibers. Generally, the light-emitting efficiency is improved by further confining lights within a core layer. However, since a diameter of a laser beam generated by the semiconductor laser fabricated by such a method becomes less than 1 µm, the optical coupling efficiency between the semiconductor laser and the optical fiber is reduced down to, for example, 10%. It is possible to increase a total efficiency by using an optical fiber having an end formed like a lens. A tapered single-mode fiber with a hemispherical lens such as the one disclosed in, for example, Electronics letters, Vol.20, No.15, 1984, may be used. However, in this case, a high accuracy is required for positioning the optical fiber to make an optical coupling. Thus, there is a problem in that a skill is required for positioning the optical fiber. Accordingly, in order to increase the optical coupling efficiency between the semiconductor laser and the optical fiber to maintain a large alignment tolerance, it is necessary to increase the diameter of the laser beam.

2. Description of the Related Art

FIG. 1A is a partially cut-away perspective view of an optical semiconductor device 10 disclosed in Japanese Laid-Open Patent Application No.7-66502 filed by the present applicant. FIG. 1B is an illustration of the optical semiconductor device 10 shown in FIG. 1A which is simplified for showing only parts related to a change of a laser beam diameter. FIG. 1C is a perspective view of a substrate on which a core layer 15 is formed. FIG. 2A is a schematic cross-sectional view of the semiconductor device shown in FIG. 1B. FIG. 2B shows a refractive index of parts shown in FIG. 2A.

As shown in FIGS. 1A and 1B, the optical semiconductor device 10 comprises a laser beam generating area 11 and a laser beam diameter changing area 12. Each of the laser beam generating area 11 and the laser beam diameter changing area 12 includes a pin junction optical waveguide comprising a core layer 15 having a multiple quantum well structure, an n-InP lower cladding layer 16 and a p-InP upper cladding layer 17. The core layer 15 has a refractive index n1. Each of the cladding layers 16 and 17 has a refractive index n2. The index of refraction n1 is greater than the refractive index n2 (n1>n2) as shown in FIG. 2B.

In order to explain a waveguide and a characteristic of light propagating through the waveguide, a confinement factor $\Gamma$, a propagation constant $\beta$ and an effective refractive index $n_{eff}$ are defined as parameters. The confinement factor $\Gamma$ corresponds to an extent of light confinement within the core layer. The confinement factor $\Gamma$ is represented by a ratio of an intensity of a light beam inside the core layer to the sum of intensities of light beams inside and outside the core layer. The propagation constant $\beta$ gives a change in phase per unit length of the light wave. The propagation constant $\beta$ in a medium having a refractive index n is represented by the following equation where $\pi$ is the ratio of the circumference of a circle to its diameter and $\lambda$ is a wavelength of light.

$$\beta = 2\pi n/\lambda \tag{1}$$

The pin junction optical waveguide has the effective refractive index $n_{eff}$ which is determined by its structure. Accordingly, the propagation constant $\beta$ of the equation (1) in the pin junction optical wavelength is represented as follows.

$$\beta = 2\pi n_{eff}/\lambda \tag{1}$$

If the structure of the pin junction optical waveguide is changed, the confinement factor $\Gamma$ is changed. This results in change of the effective refractive index $n_{eff}$. For example, if a thickness of a core layer is reduced, the confinement factor $\Gamma$ is decreased and thereby the effective refractive index $n_{eff}$ and the propagation constant $\beta$ are decreased.

The core layer 15 has a tapered portion 15a in the laser beam diameter changing area 12. A thickness of the tapered portion 15a is gradually reduced from t1 at the center to t2 toward a laser exiting surface 18 of the optical semiconductor device 10. The tapered portion 15a functions to reduce the confinement factor $\Gamma$ of the pin junction optical waveguide. That is, the propagation constant $\beta$ of the laser beam propagating through the tapered portion 15a is reduced.

An electric field generated by the laser beam in a semiconductor laser corresponding to the laser beam generating area 11 has an intensity distribution as indicated by a curved line 20 shown in FIG. 2A. The laser beam has a beam diameter of d1 in the laser beam generating area 11. The beam diameter of the laser beam is represented by a width of the curved line 20 at which the electric field intensity is equal to 1/e of a peak value, where e is the base of a natural logarithm.

Since the confinement factor $\Gamma$ is small in the laser beam diameter changing area 12, the distribution of the laser beam is extended as indicated by a curved line 21 in FIG. 2A. Thus, the diameter of the laser beam is increased from d1 to d2. Accordingly, the optical semiconductor device 10 can be connected to an optical fiber (not shown) with a relatively high optical coupling efficiency.

The transmission constant $\gamma_{cr}$ is used in an expression which represents a distribution in each of the cladding layers 16 and 17. That is, the electric field density E(y) in the cladding layer 16 or 17 is represented as follows.

$$E(y) = \exp(-\gamma_{cr}(y-y_o)) \tag{3}$$

where, y is a parameter indicating a position in a direction perpendicular to the transmitting direction of the laser beam and $y_0$ is a position corresponding to a boundary between the core layer 15 and the cladding layer 17. Accordingly, the transmission constant $\gamma_{cr}$ is represented as follows.

$$\gamma_{cr} = [\beta^2 - (2\pi n_2/\lambda)^2]^{1/2} \tag{4}$$

Where, $n_2$ is the refractive index of the cladding layers 16 and 17.

The equation (3) represents that the distribution of electric field intensity is spread when the transmission constant $\gamma_{cr}$ is reduced. Accordingly, the diameter of the laser beam is increased as the transmission constant $\gamma_{cr}$ is decreased. As previously discussed, the propagation constant β is decreased as a thickness of the core layer 15 is reduced. The equation (4) represents that the transmission constant $\gamma_{cr}$ is decreased as the propagation constant β is decreased. Accordingly, it is understood from the equations (3) and (4) that the transmission constant $\gamma_{cr}$ is reduced and the diameter of the laser beam is increased when the thickness of the core layer is reduced.

FIG. 3A is a schematically illustrated plan view of an optical semiconductor device disclosed in Japanese Laid-Open Patent Application No.5-142435. FIG. 3B is a cross-sectional view of the optical semiconductor device shown in FIG. 3A. FIG. 3C shows the index of each part of the optical semiconductor device shown in FIG. 3B.

As shown in FIGS. 3A and 3B, the optical semiconductor device 30 is composed of a beam waveguide path area 31 and a beam size changing waveguide path area 32. Each of the beam waveguide path area 31 and the beam size changing waveguide path area 32 includes, as shown in FIG. 3B, a pin junction optical waveguide which comprises a main core 33 comprising an i-MQW layer, an InP lower cladding layer 34, an InP upper cladding layer 35, InGaAs lower secondary core layers 36, InGaAs upper secondary core layers 37, an InP lower cladding layer 38 and an InP upper cladding layer 39.

The main core layer 33 has a refractive index n5. Each of the cladding layers 34, 35, 38 and 39 has a refractive index n6. Each of the secondary cores 36 and 37 has a refractive index n7. The refractive index n7 is greater than the refractive index n6, and the refractive index n5 is greater than the refractive index n7. That is, the relationship among the refractive indexes n5, n6 and n7 is represented as n6<n7<n5.

Similar to the optical semiconductor device 10, the main core layer 33 has a tapered portion 33a in the beam size changing waveguide path area 32. A thickness of the tapered portion 33a is gradually reduced from t5 at the center to t6 toward a laser exiting surface of the optical semiconductor device 30. When a laser beam is transmitted through the optical semiconductor device 30, the tapered portion 33a functions to decrease the confinement of the laser beam within the main core layer 33. Accordingly, a transmission constant $\gamma_{cr}$ of the tapered portion 33a is reduced, that is, the laser beam diameter is increased in the tapered portion 33a. Additionally, the secondary core layers 36 and 37 attract a part of the laser beam leaking from the main core layer 33. This results in an additional increase in the laser beam diameter.

An electric field generated by the laser beam in the beam waveguide path area 31 has an intensity distribution as indicated by a curved line 45 shown in FIG. 3B. The laser beam has a beam diameter of d5 in the beam waveguide path area 31.

When the laser beam enters the beam size changing waveguide path area 32, a part of the laser beam leaks from the main core layer 33. The leaking laser beam is attracted by the secondary core layers 36 and 37. The distribution of the laser beam is extended as indicated by a curved line 46 in FIG. 3B. Thus, the diameter of the laser beam is increased from d5 to d6. Accordingly, the optical semiconductor device 30 can be connected to an optical fiber (not shown) with a relatively high optical coupling efficiency. In the above-mentioned optical semiconductor devices 10 and 30, the transmission constant $\gamma_{cr}$ is reduced only by reducing the thickness t2 of the core layer 15 in the laser beam diameter changing area 12 or the thickness t6 of the main core layer 33 in the beam size changing waveguide path area 32.

It is assumed that the optical semiconductor device 10 is coupled to a single mode optical fiber having a core having a 10-μm diameter. The thickness t1 of the core layer 15 in the laser beam generating area 11 is fixed to a specific value while the thickness t2 of the core layer 15 in the laser beam diameter changing area 12 is varied so that calculations can be performed by changing the thickness of the beam diameter changing area 12. The reason for fixing the thickness ti of the core layer 15 is to maintain the confinement factor Γ at a desired value.

A ratio K is defined as a parameter as follows.

$$k = t2/t1 \quad (5)$$

The ratio k of the thickness t1 to the thickness t2 is varied by changing the thickness t2. The ratio k is hereinafter referred to as a relative thickness k of the core layer. A description will now be given of the characteristics of the device when the relative thickness k is varied.

The distribution of intensity at the surface 18 shown in FIG. 2A was calculated by changing the relative thickness k, and an overlap integral is performed with a Gaussian beam having a 10-μm spot diameter. The calculation of the overlap integral corresponds to a calculation of the optical coupling efficiency between the optical semiconductor device 10 and the optical fiber. Thus, hereinafter the rate of overlapping obtained by the result of the overlap integral performed with the distribution of intensity of the electric field and the 10-μm beam spot Gaussian beam is referred to as the optical coupling efficiency.

The result of the calculation of the optical coupling efficiency is shown in FIG. 4. From the graph of FIG. 4, it is appreciated that the optical coupling efficiency of 80% is obtained when the relative thickness k of the core layer 15 is set to 0.25, that is, when the thickness t2 is reduced to one fourth of the thickness t1.

The tapered portion 15a of which thickness is gradually reduced can be formed by the following method. That is, as shown in FIG. 1C, a crystal growth method such as a liquid-phase epitaxial growth or a vapor-phase epitaxial growth is applied to a substrate having dielectric material films 48. This method is hereinafter referred to as an area selective crystal growth method. A window 49 gradually expanding toward an end of the substrate is formed between the dielectric material films 48. The detail of the formation of the tapered portion is provided in Technical Report of The Institute of Electrical Engineers of Japan, OQD-91-58. Other methods such as an etching method may be used. However, the area selective crystal growth method has an advantage in that a fabrication of the device is easy as compared to other methods, and fewer crystal defects are formed in a core layer as compared to the etching method since the core layer is not exposed to air such as in the etching method.

However, the area-selective crystal growth method has a problem in that a strain is generated in crystals. This is due to variation in lattice constant between a thick portion and a thin portion. This phenomenon is indicated by a result of experiments described in Extended Abstracts (The 38th Spring Meeting, 1991); The Japanese Society of Applied Physics and related Societies, No.28p-zk-3, page 222. A degree of the strain is generally proportional to a variation in the thickness. Accordingly, if a rate of variation in the thickness is increased, the degree of strain of crystals is increased. This leads to a decreased yield and reliability.

Additionally, if the rate of variation in the thickness is increased, there is a problem in that the fabrication of the core layer becomes difficult. For example, the fabrication process of the optical semiconductor device includes: growing crystals of the semiconductor layer in a mesa-shape and in the same shape as the window 49 shown in FIG. 1A by the area selective crystal growth method; performing a mesa etching so as to form a mesa having a width less than the mesa width which is obtained immediately after the crystal growth. On the other hand, a width of the window 49 corresponding to the laser beam generating area 11 must be reduced so as to increase the changing ratio of the thickness of the core layer. For example, the width of the window 49 must be decreased down to about 10 μm when the relative thickness is set to 0.25. If the area-selective crystal growth method is used, the growth of crystals is uneven such that the crystal layer adjacent to a boundary between the window and the masked part becomes thicker than other portions of the crystal layer. (The detail is explained in the Technical Report of The Institute of Electrical Engineering of Japan, OQD-91-58.) Thus, if the width of the window is narrow, the thickness of the core layer in the laser beam generating area 11 becomes uneven, resulting in deterioration of the performance of the optical semiconductor device. Additionally, there is a problem in that a positioning of the mask for the mesa etching is difficult.

The above-mentioned problems may occur in the semiconductor device 30 shown in FIGS. 3A and 3B.

SUMMARY OF THE INVENTION

It is a general object of the present invention to provide an improved and useful optical semiconductor device in which the above-mentioned problems are eliminated.

A more specific object of the present invention is to provide an optical semiconductor device in which a transmission constant is greatly decreased even when a reduction rate in the thickness of a core layer is small so that a relatively high beam-diameter increasing efficiency is obtained.

In order to achieve the above-mentioned objects, there is provided according to the present invention an optical semiconductor device having a multilayered structure and having a first end surface perpendicular to an optical axis of the optical semiconductor device and a second end surface opposite to the first end surface, the optical semiconductor device comprising:

a core layer having a first refractive index;

a lower cladding layer provided on a lower side of the core layer, the lower cladding layer having a second refractive index;

an upper cladding layer provided on an upper side of the core layer, the upper cladding layer having the second refractive index; and a transmission constant reduction enhancing layer provided between the lower cladding layer and the upper cladding layer, the transmission constant reduction enhancing layer having a third refractive index less than the first refractive index and the second refractive index, wherein the optical semiconductor device includes a first area and a second area, a portion of the core layer in the first area having a uniform thickness, a portion of the core layer in the second area having a thickness gradually decreasing toward the first end surface of the optical semiconductor device.

According to the present invention, the transmission constant reduction enhancing layer increase a reduction rate in an effective refraction index of the second area when the thickness of the core layer in the second area is decreased. Thus, a reduction rate of a transmission constant of the cladding layers in the second area is increased. As a result, the reduction rate in the thickness of the core layer in the second area can be less than that of the conventional optical semiconductor device. That is, the optical semiconductor device according to the present invention can increase a beam diameter further than the conventional optical semiconductor device with a same reduction rate in the thickness of the core layer in the second area. Accordingly, an optical coupling efficiency of the optical semiconductor device according to the present invention is increased and becomes less dependent on the reduction rate in the thickness of the core layer. This allows the core layer to be formed by the selective-area crystal growth method with less residual strain in the core layer.

In one embodiment of the present invention, the transmission constant reduction enhancing layer is provided between the core layer and the lower cladding layer. A secondary core layer may be provided between the transmission constant reduction enhancing layer and the lower cladding layer, the secondary core layer having a third refractive index less than the first refractive index and greater than the second refractive index. The second core layer attracts a portion of the laser beam leaking from the core layer.

Additionally, a portion of the transmission constant reduction enhancing layer in the second area may have a thickness gradually decreasing toward the end surface of the optical semiconductor device. A secondary core layer may be provided between the transmission constant reduction enhancing layer and the lower cladding layer, the secondary core layer having a fourth refractive index less than the first refractive index and greater than the second refractive index.

In another embodiment of the present invention, the transmission constant reduction enhancing layer is provided between the core layer and the upper cladding layer. A secondary core layer may be provided between the core layer and the lower cladding layer, the secondary core layer having a fourth refractive index less than the first refractive index and greater than the second refractive index.

Additionally, a portion of the transmission constant reduction enhancing layer in the second area has a thickness gradually decreasing toward the end surface of the optical semiconductor device. A secondary core layer may be provided between the core layer and the lower cladding layer, the secondary core layer having a fourth refractive index less than the first refractive index and greater than the second refractive index.

In another embodiment of the present invention, the transmission constant reduction enhancing layer includes a lower transmission constant reduction enhancing layer and an upper transmission constant reduction enhancing layer, the lower transmission constant reduction enhancing layer provided between the core layer and the lower cladding layer, the upper transmission constant reduction enhancing layer provided between the core layer and the upper cladding layer. A secondary core layer may be provided between the lower transmission constant reduction enhancing layer and the lower cladding layer, the secondary core layer having a fourth refractive index less than the first refractive index and greater than the second refractive index.

Additionally, a portion of each of the lower transmission constant reduction enhancing layer and the upper transmission constant reduction enhancing layer in the second area has a thickness gradually decreasing toward the end surface of the optical semiconductor device. A secondary core layer may be provided between the lower transmission constant reduction enhancing layer and the lower cladding layer, the secondary core layer having a fourth refractive index less than the first refractive index and greater than the second refractive index.

In the optical semiconductor device according to the present invention, the layered structure in the first area may correspond to a double hetero pin junction structure in which the core layer is an intrinsic layer. A first electrode may be provided on a top surface of the optical semiconductor device in the first area and a second electrode may be provided on a bottom surface of the optical semiconductor device so that a voltage is supplied across the core layer in the first portion via the first electrode and the second electrode.

Additionally, in the optical semiconductor device according to the present invention, the layered structure in the first area corresponds to a double hetero pin junction structure in which the core layer is an intrinsic layer. An optical reflector may be provided on each of the first end surface and the second end surface. A first electrode may be provided on a top surface of the optical semiconductor device in the first area and a second electrode may be provided on a bottom surface of the optical semiconductor device so that a current is supplied across the core layer in the first portion via the electrode an first electrode and the second electrode.

If the transmission constant reduction enhancing layer is provided on the lower side of the core layer, the layered structure in the first area may correspond to a double hetero pin junction structure in which the core layer is an intrinsic layer; a diffraction-grating type optical reflector may be provided between the lower transmission constant reduction enhancing layer and the lower cladding layer in the first area, the diffraction-grating type optical reflector being formed as a boundary having a periodical unevenness; a first electrode may be provided on a top surface of the optical semiconductor device in the first area and a second electrode may be provided on a bottom surface of the optical semiconductor device so that a laser beam is generated in the core layer in the first area by supplying a current via the first electrode and the second electrode, the laser beam passing through the second area and exiting from the first end surface.

If the transmission constant reduction enhancing layer is provided on the upper side of the core layer, the layered structure in the first area may correspond to a double hetero pin junction structure in which the core layer is an intrinsic layer; a diffraction-grating type optical reflector may be provided between the transmission constant reduction enhancing layer and the upper cladding layer in the first area, the diffraction-grating type optical reflector being formed as a boundary having a periodical unevenness; a first electrode may be provided on a top surface of the optical semiconductor device in the first area and a second electrode may be provided on a bottom surface of the optical semiconductor device so that a laser beam is generated in the core layer in the first area by supplying a current via the first electrode and the second electrode, the laser beam passing through the second area and exiting from the first end surface.

In one embodiment of the present invention, the layered structure in the first area corresponds to a double hetero pin junction structure in which the core layer is an intrinsic layer. A first electrode may be provided on a top surface of the optical semiconductor device in the first area and a second electrode may be provided on a bottom surface of the optical semiconductor device so that an electric field is generated in the core layer in the first area by supplying a voltage across the first electrode and the second electrode.

In the embodiment having the diffraction-grating type optical reflector, a third area may be provided between the first area and the second area, a third electrode being provided on a top surface in the third area and the second electrode being extended in the third area, the laser beam generated in the first area being modulated by an electric field generated by a voltage supplied across the third electrode and the second electrode in the third area before entering the second area.

In one embodiment of the present invention, there may be provided a third area having the same structure as the second area, the third area provided on an opposite side with respect to the first area so that the second end surface corresponds to an end surface of the third area which is remote from the first area, the layered structure in the first area corresponds to a double hetero pin junction structure in which the core layer is an intrinsic layer, a first electrode being provided on a top surface and a second electrode being provided on a bottom surface in the first area so that a laser beam passing through the first area is amplified by a current supplied via the first electrode and the second electrode.

In another embodiment, there may be provided a third area having the same structure as the second area, the third area provided on an opposite side with respect to the first area so that the second end surface corresponds to an end surface of the third area which is remote from the first area, the layered structure in the first area corresponding to a double hetero pin junction structure in which the core layer is an intrinsic layer, a first electrode being provided on a top surface and a second electrode being provided on a bottom surface in the first area so that a laser beam passing through the first area is modulated by an electric field generated by a voltage supplied across the first electrode and the second electrode.

In another embodiment, there may be provided a third area having the same structure as the second area, the third area provided on an opposite side with respect to the first area so that the second end surface corresponds to an end surface of the third area which is remote from the first area, the layered structure in the first area corresponding to a double hetero pin junction structure in which the core layer is an intrinsic layer, an optical reflector being provided on each of the first end surface and the second end surface, a first electrode being provided on a top surface and a second electrode being provided on a bottom surface in the first area so that a laser beam is generated in the core layer in the first area by supplying a current via the first electrode and the second electrode, the laser beam exiting from each of the first end surface and the second end surface.

Additionally, in one embodiment according to the present invention, there may be provided a third area having the same structure as the second area, the third area provided on an opposite side with respect to the first area so that the second end surface corresponds to an end surface of the third area which is remote from the first area, the layered structure in the first area corresponding to a double hetero pin junction structure in which the core layer is an intrinsic layer, an optical reflector being provided on each of the first end surface and the second end surface, the diffraction-grating type optical reflector being a ¼ wavelength shifted diffraction-grating so that the diffraction-grating type optical reflector has a wavelength dependency with respect to reflection and transmission of light, a first electrode being provided on a top surface and a second electrode being provided on a bottom surface in the first area so that a laser beam is generated in the core layer in the first area by supplying a current via the first electrode and the second electrode, the laser beam exiting from each of the first end surface and the second end surface.

In the optical semiconductor device according to the present invention, the upper cladding layer in the second area may have a thickness gradually increasing toward the first end surface. Additionally, the first electrode may be extended to a portion of the second area adjacent to the first area. Further, a thickness of each layer in the second area adjacent to the second end surface may be uniform.

Other objects, features and advantages of the present invention will become more apparent form the following detailed description when read in conjunction with the accompanying drawings.

BRIEF DESCRIPTION OF THE DRAWINGS

FIG. 3A is a schematically illustrated plan view of an optical semiconductor device;

FIG. 3B is a cross-sectional view of the optical semiconductor device shown in FIG. 3A;

FIG. 3C is an illustration showing the index of each part of the optical semiconductor device shown in FIG. 3B;

FIG. 6A is a cross-sectional view of the optical semiconductor device shown in FIG. 5A;

FIG. 6B is an illustration for explaining a distribution of refractive indexes;

FIG. 8 is a graph showing a variation of a transmission constant $\gamma_{cr}$ when a relative thickness of the core layer is varied;

FIG. 13A is a cross-sectional view of an optical semiconductor device according to a second embodiment of the present invention.

FIG. 13B is an illustration for explaining a distribution of refractive indexes in the optical semiconductor device shown in FIG. 13A;

FIG. 14A is a cross-sectional view of an optical semiconductor device according to a third embodiment of the present invention.

FIG. 14B is an illustration for explaining a distribution of refractive indexes in the optical semiconductor device shown in FIG. 14A;

FIG. 15A is a cross-sectional view of an optical semiconductor device according to a fourth embodiment of the present invention.

FIG. 15B is an illustration for explaining a distribution of refractive indexes in the optical semiconductor device shown in FIG. 15A;

FIG. 17A is a cross-sectional view of an optical semiconductor device according to a fifth embodiment of the present invention.

FIG. 17B is an illustration for explaining a distribution of refractive indexes in the optical semiconductor device shown in FIG. 17A;

FIG. 18A is a cross-sectional view of an optical semiconductor device according to a sixth embodiment of the present invention.

FIG. 18B is an illustration for explaining a distribution of refractive indexes in the optical semiconductor device shown in FIG. 18A;

FIG. 22A is a cross-sectional view of an optical semiconductor device according to an eighth embodiment of the present invention.

FIG. 22B is an illustration for explaining a distribution of refractive indexes in the optical semiconductor device shown in FIG. 22A;

11

FIG. 24A is a cross-sectional view of an optical semiconductor device according to a tenth embodiment of the present invention.

Figure 25:
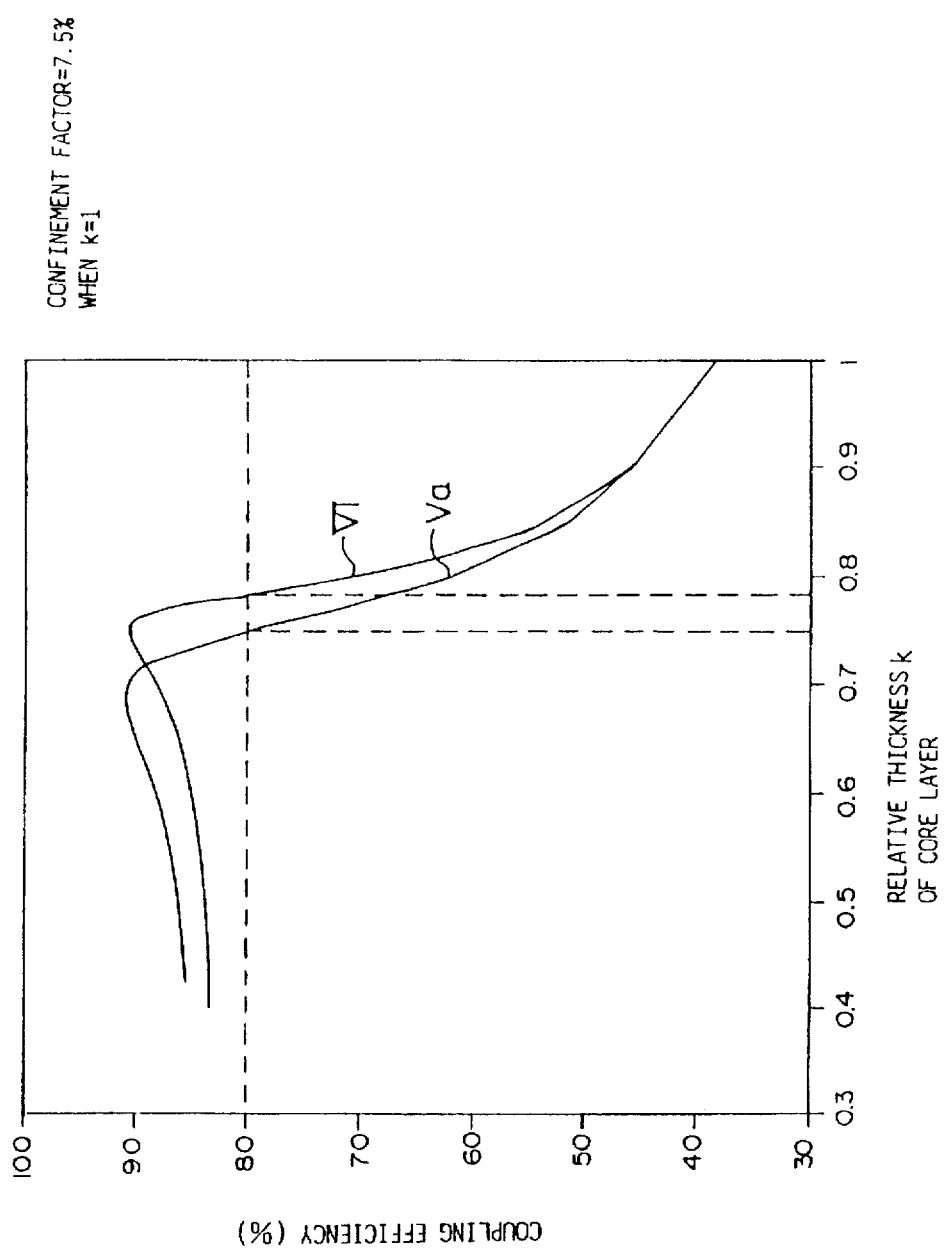
Figure 26B:
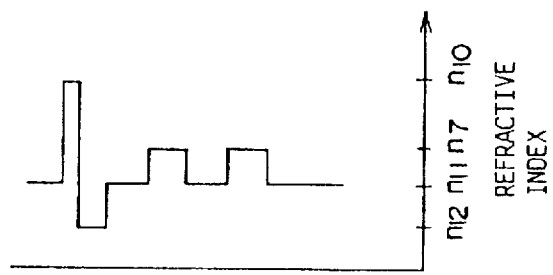
Figure 26A:
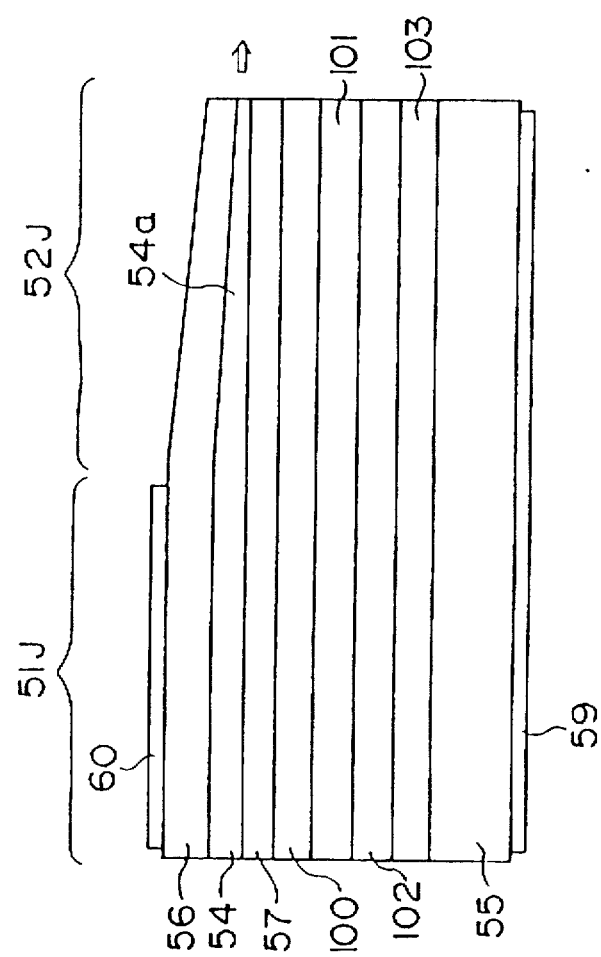

FIG. 24B is an illustration for explaining a distribution of refractive indexes in the optical semiconductor device shown in FIG. 24A;

FIG. 25 is a graph showing a variation in a coupling efficiency of the optical semiconductor device shown in FIG. 24A;

FIG. 26A is a cross-sectional view of an optical semiconductor device according to an eleventh embodiment of the present invention.

FIG. 26B is an illustration for explaining a distribution of refractive indexes in the optical semiconductor device shown in FIG. 26A;

FIG. 27A is a cross-sectional view of an optical semiconductor device according to a twelfth embodiment of the present invention.

Figures 28A, 28B:
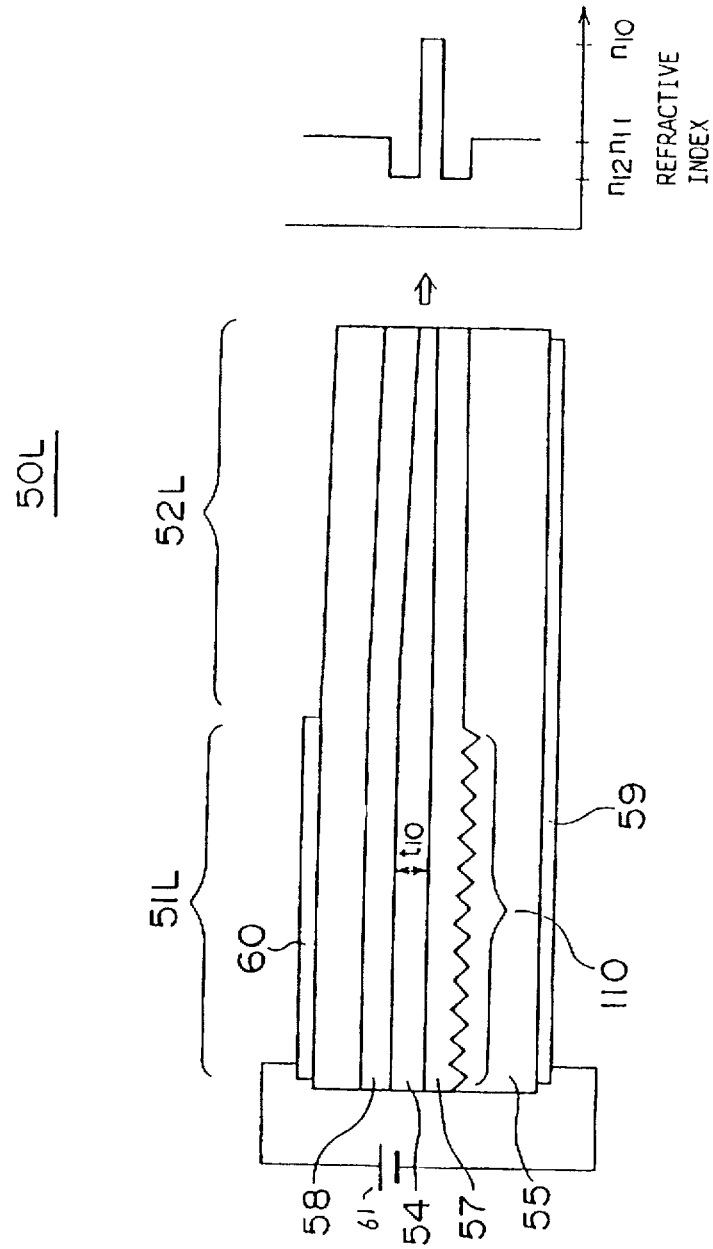

FIG. 27B is an illustration for explaining a distribution of refractive indexes in the optical semiconductor device shown in FIG. 27A;

FIG. 28A is a cross-sectional view of an optical semiconductor device according to a thirteenth embodiment of the present invention.

FIG. 28B is an illustration for explaining a distribution of refractive indexes in the optical semiconductor device shown in FIG. 28A;

FIG. 29A is a cross-sectional view of an optical semiconductor device according to a fourteenth embodiment of the present invention.

FIG. 29B is an illustration for explaining a distribution of refractive indexes in the optical semiconductor device shown in FIG. 29A;

FIG. 30A is a cross-sectional view of an optical semiconductor device according to a fifteenth embodiment of the present invention.

FIG. 30B is an illustration for explaining a distribution of refractive indexes in the optical semiconductor device shown in FIG. 30A;

FIG. 31A is a cross-sectional view of an optical semiconductor device according to a sixteenth embodiment of the present invention.

FIG. 31B is an illustration for explaining a distribution of refractive indexes in the optical semiconductor device shown in FIG. 31A;

FIG. 32A is a cross-sectional view of an optical semiconductor device according to a seventeenth embodiment of the present invention.

FIG. 32B is an illustration for explaining a distribution of refractive indexes in the optical semiconductor device shown in FIG. 32A;

FIG. 33A is a cross-sectional view of an optical semiconductor device according to an eighteenth embodiment of the present invention.

FIG. 33B is an illustration for explaining a distribution of refractive indexes in the optical semiconductor device shown in FIG. 33A;

FIG. 34A is a cross-sectional view of an optical semiconductor device according to a nineteenth embodiment of the present invention.

FIG. 34B is an illustration for explaining a distribution of refractive indexes in the optical semiconductor device shown in FIG. 34A;

12

Figure 36:
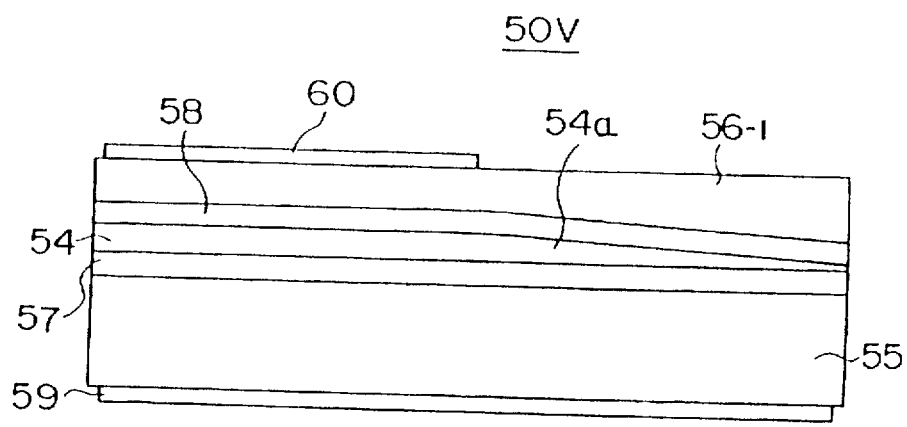
Figure 37:
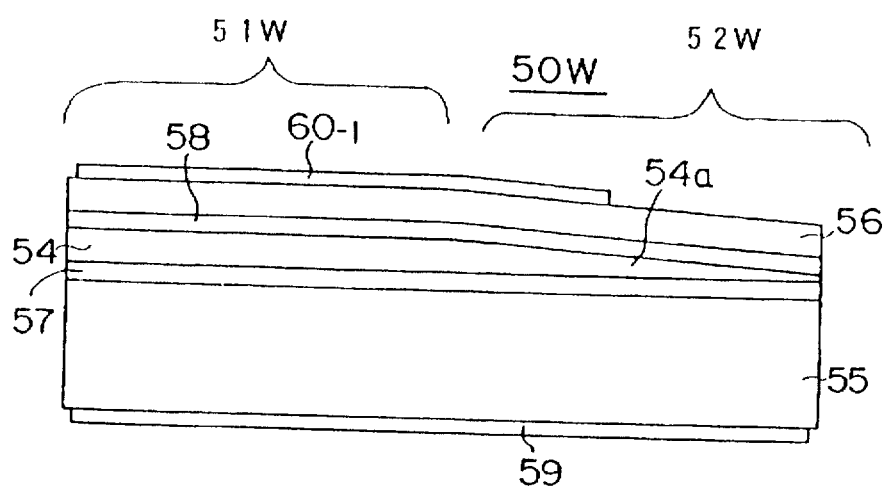
Figure 38:
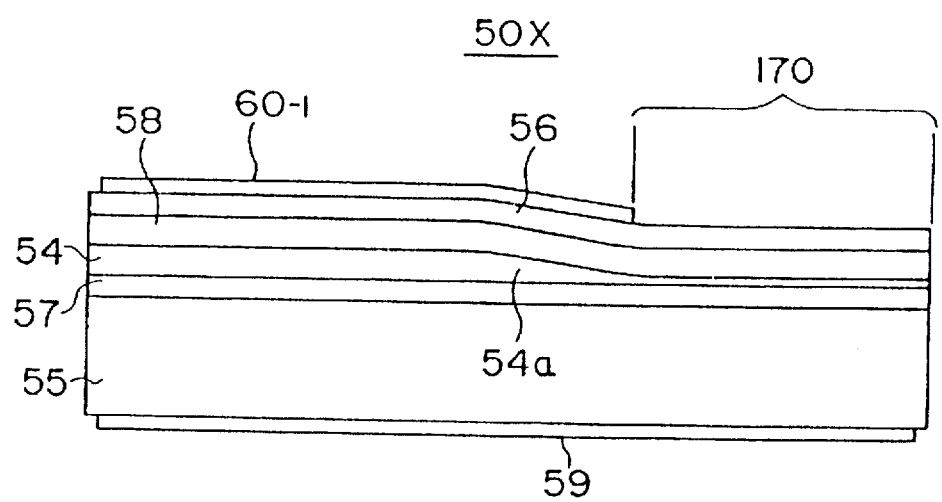

FIG. 35A is a cross-sectional view of an optical semiconductor device according to a twentieth embodiment of the present invention;

FIG. 35B is an illustration for explaining a distribution of refractive indexes in the optical semiconductor device shown in FIG. 35A;

FIG. 35C is an enlarged cross-sectional view of a part of a diffraction grating shown in FIG. 35A;

FIG. 35D is an enlarged cross-sectional view of a part of a variation of the diffraction grating shown in FIG. 35C;

FIG. 36 is a cross-sectional view of an optical semiconductor device according to a twenty-first embodiment of the present invention;

FIG. 37 is a cross-sectional view of an optical semiconductor device according to a twenty-second embodiment of the present invention; and FIG. 38 is a cross-sectional view of an optical semiconductor device according to a twenty-third embodiment of the present invention.

DETAILED DESCRIPTION OF THE PREFERRED EMBODIMENTS

Figure 1A:
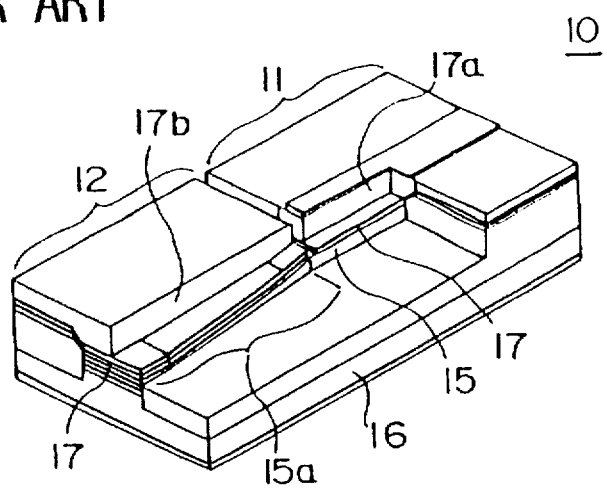
FIG. 1A is a partially cut-away perspective view of an optical semiconductor device 10.
Figure 1B:
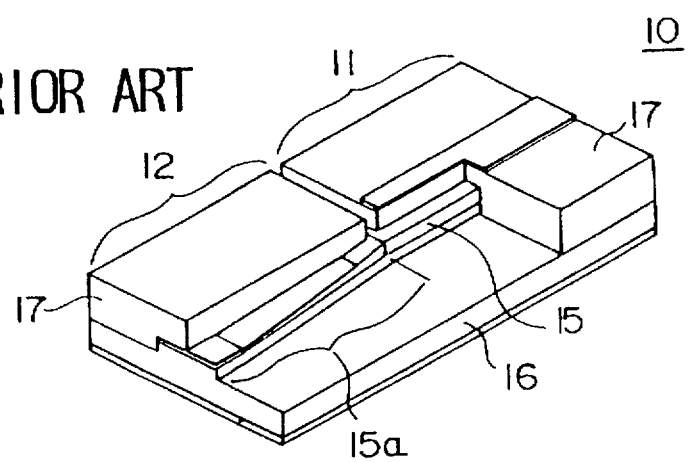
FIG. 1B is an illustration of the optical semiconductor device shown in FIG. 1A which is simplified for showing only parts related to a change of a laser beam diameter.
Figure 1C:
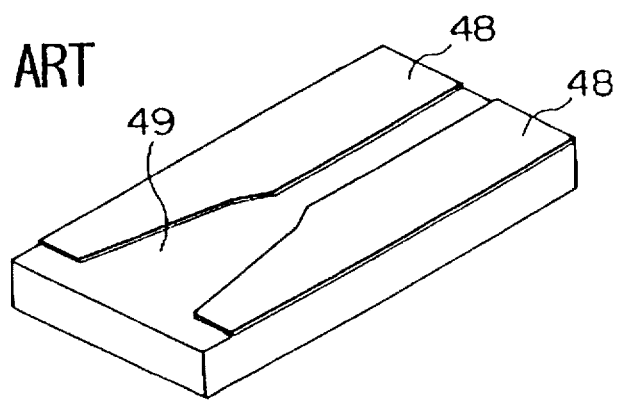
FIG. 1C is a perspective view of a substrate on which a core layer is formed.
Figures 2A, 2B:
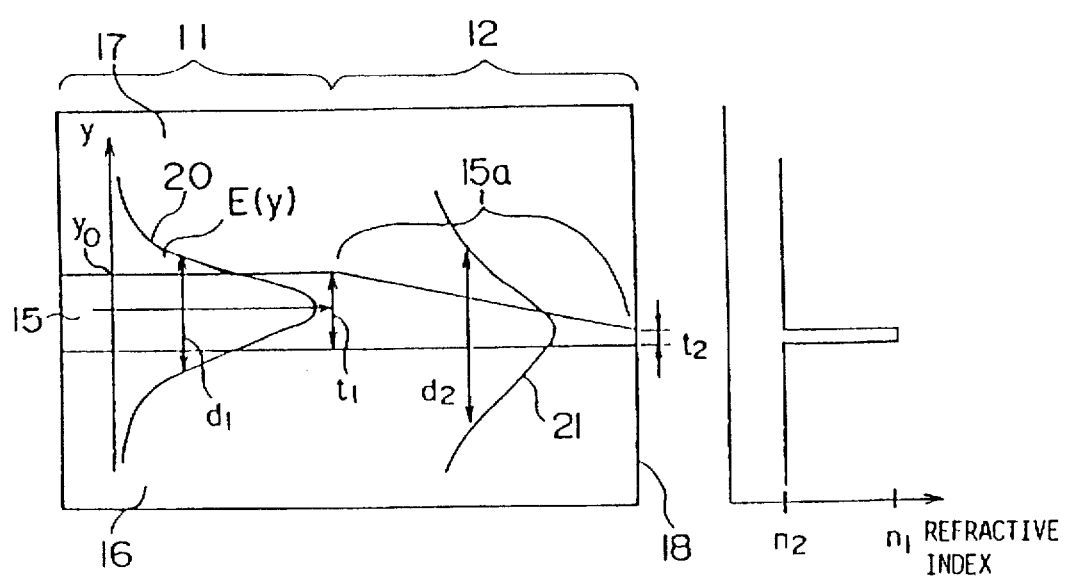
FIG. 2A is a schematic cross-sectional view of the semiconductor device shown in FIG. 1B.
FIG. 2B is an illustration showing refractive indexes of parts shown in FIG. 2A.
Figure 4:
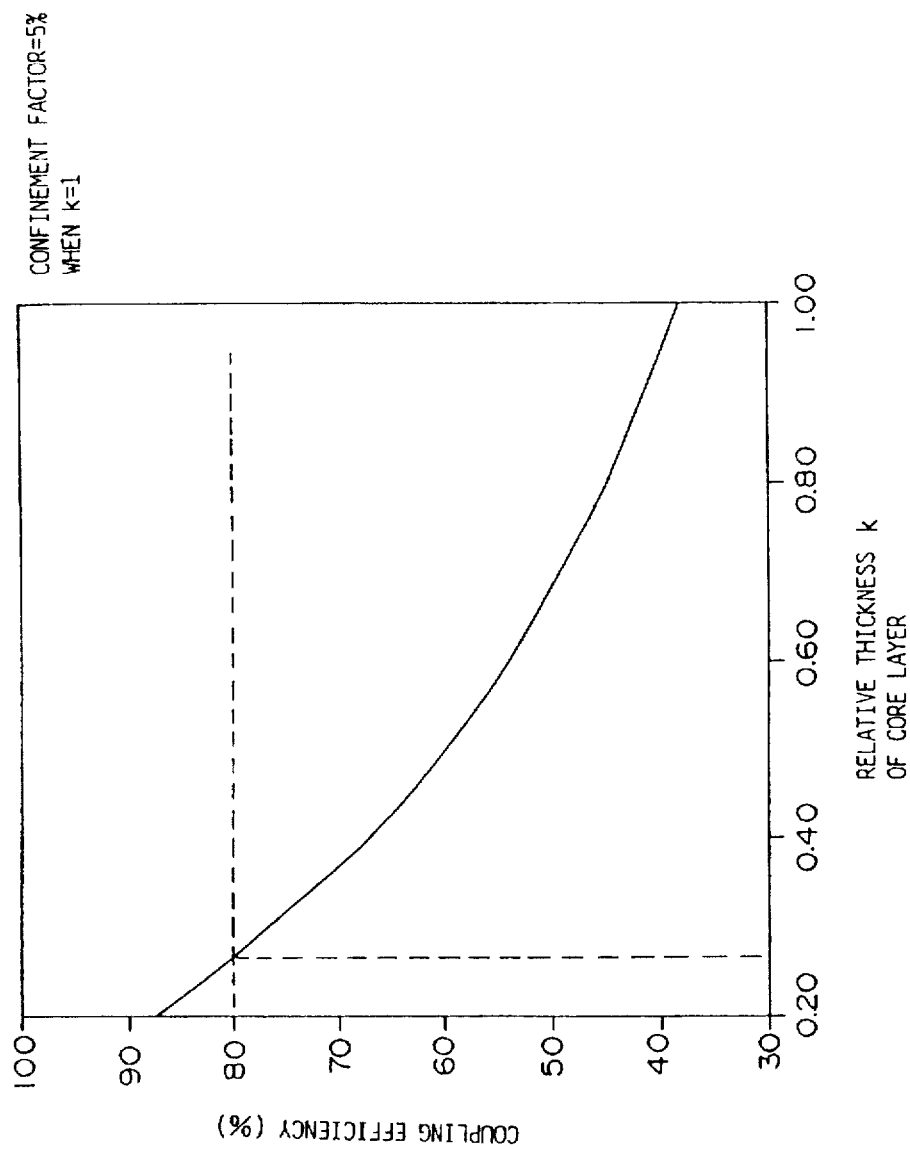
FIG. 4 is a graph showing a result of calculation of an optical coupling efficiency.
Figure 5A:
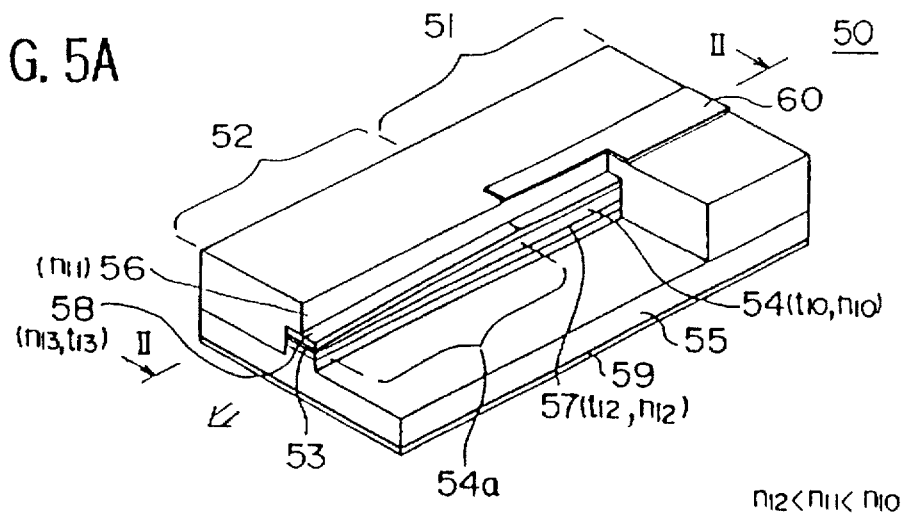
FIG. 5A is a perspective view of an optical semiconductor device according to a first embodiment of the present invention, the optical semiconductor device having a core layer having a uniform width.
Figure 5B:
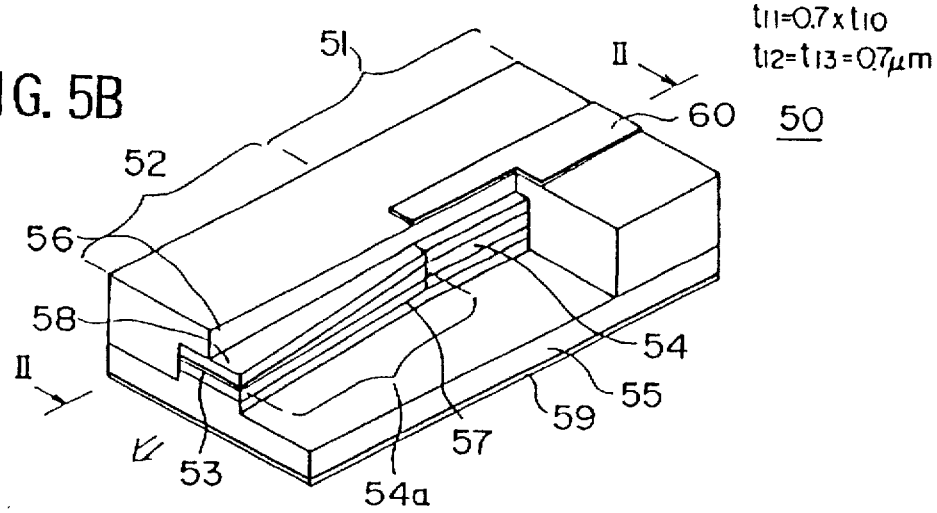
FIG. 5B is a perspective view of a variation of the first embodiment having the core layer, a width of the core layer in a tapered portion being gradually increases toward a beam exiting surface.
Figure 5C:
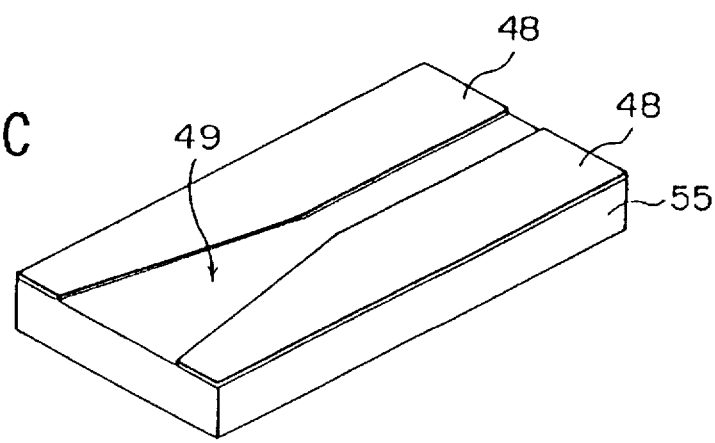
FIG. 5C is a perspective view of a substrate on which the core layer is formed.

A description will now be given, with reference to FIGS. 5A, 5B and 5C and FIG. 6, of an optical semiconductor device 50 according to a first embodiment of the present invention. FIG. 5A is a perspective view of the optical semiconductor device 50 having a core layer 54 having a uniform width. FIG. 5B is a perspective view of a variation of the first embodiment having the core layer 54, a width of the core layer in a tapered portion 54a being gradually increasing toward a beam exiting surface 53. FIG. 5C is a perspective view of a substrate on which the core layer 54 is formed.

The optical semiconductor apparatus 50 is composed of a laser beam generating area 51 and a laser beam diameter changing area 52. The optical semiconductor device 50 is specifically a semiconductor laser. The beam exiting surface 53 is provided at the end of the laser beam diameter changing area 52.

The optical semiconductor apparatus 50 comprises the core layer 54, an InGaAsP substrate 55 as a lower cladding layer, an upper cladding layer 56 made of InGaAsP, transmission constant reduction enhancing layers 57 and 58, a lower electrode 59 and an upper electrode 60. The transmission constant reduction enhancing layer 57 is interposed between the core layer 54 and the lower cladding layer 55. The transmission constant reduction enhancing layer 58 is interposed between the core layer 54 and the upper cladding layer 56.

The cladding layer 55 and the transmission constant reduction enhancing layer 57 are n-type semiconductors. The cladding layer 56 and the transmission constant reduction enhancing layer 58 are p-type semiconductors. The core layer 54 is a non-doped semiconductor. Since the core layer 54 is of a non-doped type, the core layer 54 is substantially an intrinsic layer (i layer). Additionally, the refractive index of the core layer is the highest among the above-mentioned layers. As shown in FIG. 6A, a pin junction optical waveguide is formed by interposing the core layer 54, which is of a non-doped type and has a high refractive index, between the layers of p-type and n-type.

The beam exiting surface 53 and an opposite surface comprise a cleaved facet. The cleaved facet can be used as a reflector 53m which reflects a light beam. If silicon oxide film or silicon nitride film having a thickness of a ¼ wavelength of the laser beam is provided on a surface of the cleaved facet, the surface 53 can be used as an optical input/output surface 53a having a low reflectance. This applies to other embodiments described later.

Figure 7:
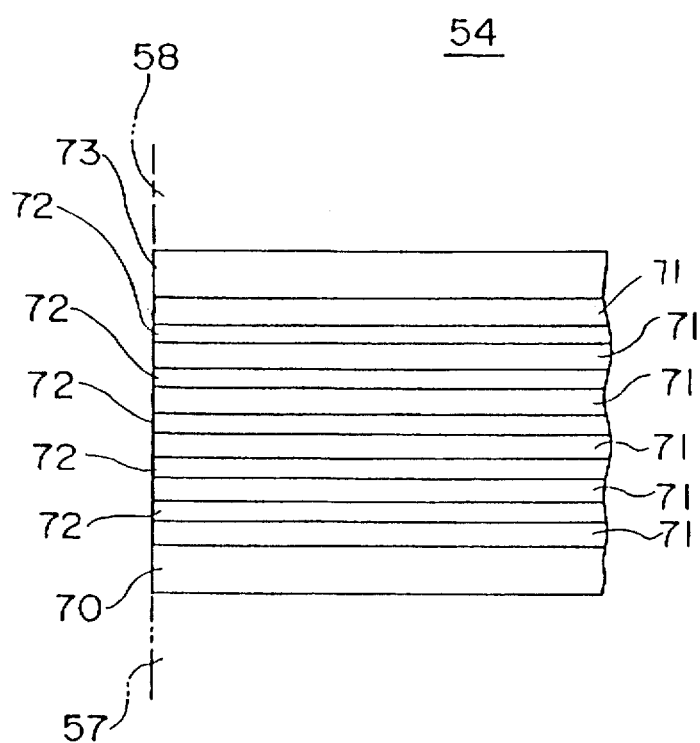
FIG. 7 is a enlarged cross-sectional view of a part of a core layer shown in FIG. 6A.
Figure 9A:
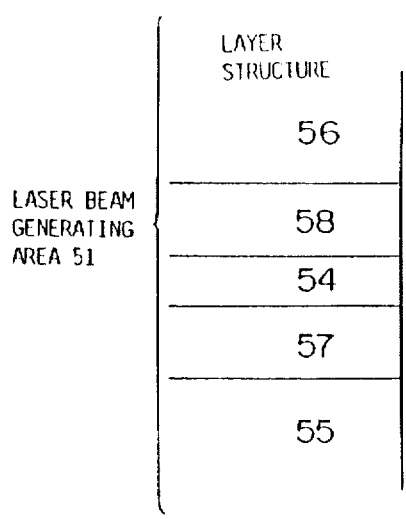
FIG. 9A is an illustration of a layer structure of the optical semiconductor device shown in FIG. 6A in a laser beam generating area.
Figure 9B:
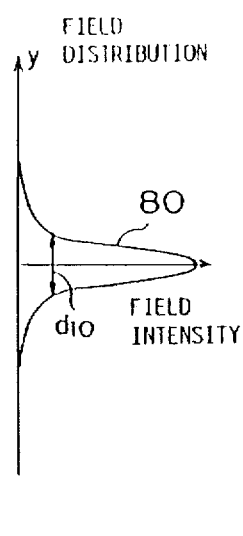
FIG. 9B is a graph showing a field distribution in the laser beam generating area.
Figure 9C:
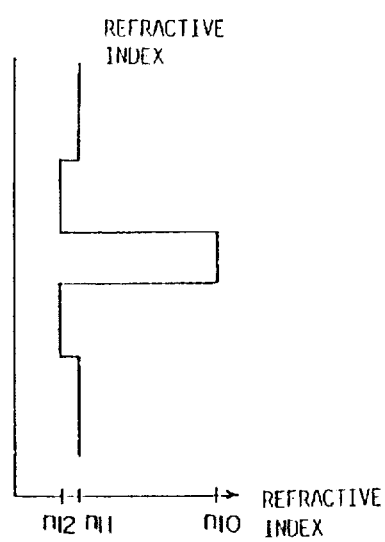
FIG. 9C is an illustration for explaining a distribution of refractive indexes in the laser beam generating area.
Figure 9D:
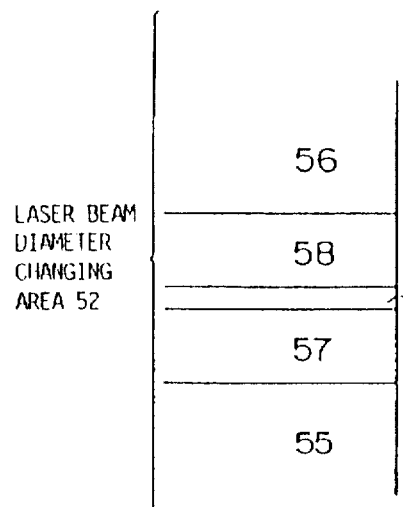
FIG. 9D is an illustration of a layer structure of the optical semiconductor device shown in FIG. 6A in a laser beam diameter changing area.
Figure 9E:
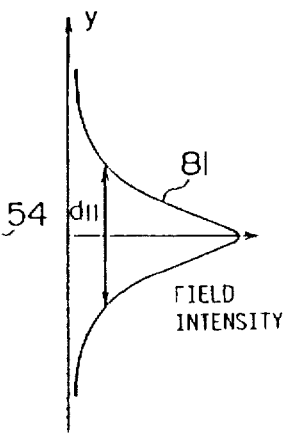
FIG. 9E is a graph showing a field distribution in the laser beam diameter changing area.
Figure 9F:
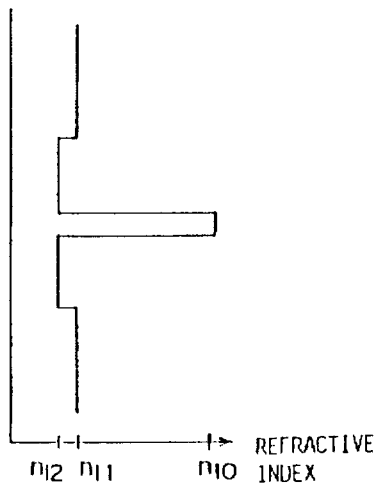
FIG. 9F is an illustration for explaining a distribution of refractive indexes in the laser beam diameter changing area.

The core layer 54 is formed on a substrate 55 having the dielectric material films 48 by using the area-selective crystal growth method. The window 49 is formed between the dielectric material films 48. The core layer 54 is composed of a multiple quantum well structure as shown in FIG. 7. That is, the core layer 54 comprises guiding layers 70 and 73 made of InGaAs, six barrier layers 71 made of InGaAsP and five well layers 72 made of InGaAs. Each of the guiding layers 70 and 73 has a thickness of 0.01–0.03 μm in the laser beam generating area 51. Each of the barrier layers 71 has a thickness of 10 nm in the laser beam generating area 51. Each of the well layers 72 has a thickness of 7 nm in the laser beam generating area 51. Although a refractive index of each of the layers is different from layer to layer, an effective refractive index n10 may be used for an entire core layer 54.

A lattice constant of each of the layers 70–73 is almost equal to the lattice constant of InP. A light wavelength converted band gap energy λg of the guiding layers 70 and 73 is 1.139 μm. λg of each of the barrier layers 71 is 1.3 μm. The core layer 54 is a non-doped type and is substantially an intrinsic layer (i layer).

The core layer 54 has a tapered portion 54a in the laser beam diameter changing area 52. The tapered portion 54a gradually decreases from t10 to t11 toward the beam exiting surface 53. The thickness t11 at the beam exiting surface 53 is about 70% of the thickness t10, that is, t11=0.7×t10. The tapered portion 54a has a wedge-shaped cross-section as shown in FIG. 6A. The tapered portion 54a has a belt-like shape as shown in FIG. 5A or a sector-like shape as shown in FIG. 5B. In the present embodiment, the relative thickness k=t11/t10 is about 0.4–0.7.

The substrate 55 serves as a lower cladding layer. Thus, the optical semiconductor device 50 does not have an independent lower cladding layer. The substrate 55 has a refractive index n11. The refractive index n11 is less than the refractive index n10 (n11<n10). λg of the substrate 55 is 0.942 μm.

The upper cladding layer 56 has a thickness of 2–3 μm. The upper cladding layer 56 has a refractive index n11 equal to that of the substrate 55. λg of the upper cladding layer 56 is 0.942 μm.

Each of the layers 57 and 58 is made of InP and has a refractive index n12. As shown in FIG. 6B, the refractive index n12 is less than the refractive index n11 (n12<n11). Each of the layers 57 and 58 has a uniform thickness over an entire area thereof.

The optical semiconductor device 50 oscillates a laser beam when a current is supplied in a forward (normal) direction of the pin junction by applying a bias voltage between the electrodes 59 and 60 as shown in FIG. 6A by a power source 61.

FIG. 8 is a graph showing a variation of the transmission constant $\gamma_{cr}$ when the relative thickness k of the core layer 54 is varied. In FIG. 8, a curve indicated by Ib is obtained when the thickness t12 of the transmission constant reduction enhancing layer 57 and the thickness t13 of the transmission constant reduction enhancing layer 58 are set to 0.2 μm. A curve indicated by Ia is obtained when the thickness t12 of the transmission constant reduction enhancing layer 57 and the thickness t13 of the transmission constant reduction enhancing layer 58 are set to 0.7 μm. A curve indicated by Ic is for the conventional apparatus which does not have the transmission constant reduction enhancing layers 57 and 58. In each case, the thickness of each layer is determined so that a confinement factor becomes 5%. Specifically, the curve Ib is obtained when the thickness of the guiding layers 70 and 73 is set to 0.248 μm, and the thickness of the upper cladding layer 56 is set to 2.8 μm. The curve Ic is obtained when the thickness of the guiding layers 70 and 73 is set to 0.284 μm, and the thickness of the upper cladding layer 56 is set to 2.8 μm.

As shown by the graph in FIG. 8, the transmission constant $\gamma_{cr}$ is decreased when the transmission constant reduction enhancing layers 57 and 58 are present. Additionally, the transmission constant $\gamma_{cr}$ is decreased as the relative thickness k is increased. As a result, as shown in FIGS. 9A–9F, the laser beam 80 having a beam diameter d10 generated in the laser beam generating area 51 is converted into the laser beam 81 having a beam diameter d11 which is much greater than the diameter d10.

Figure 10:
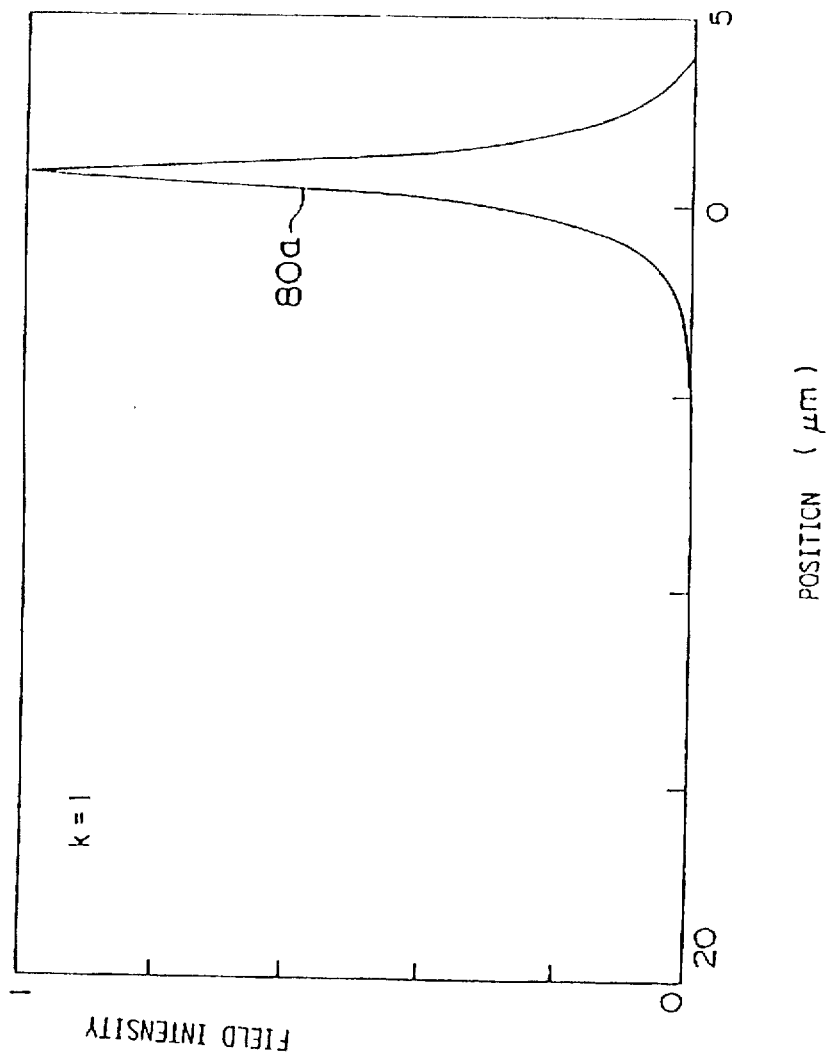
FIG. 10 is a graph showing a result of calculation of field intensity in a laser beam generating area.

FIG. 10 is a graph showing a result of calculation of field intensity in the laser beam generating area 51 when the thickness t12 of the transmission constant reduction enhancing layer 57 and the thickness t13 of the transmission constant reduction enhancing layer 58 are 0.7 μm. The beam diameter is about 1.2 μm.

Figure 11:
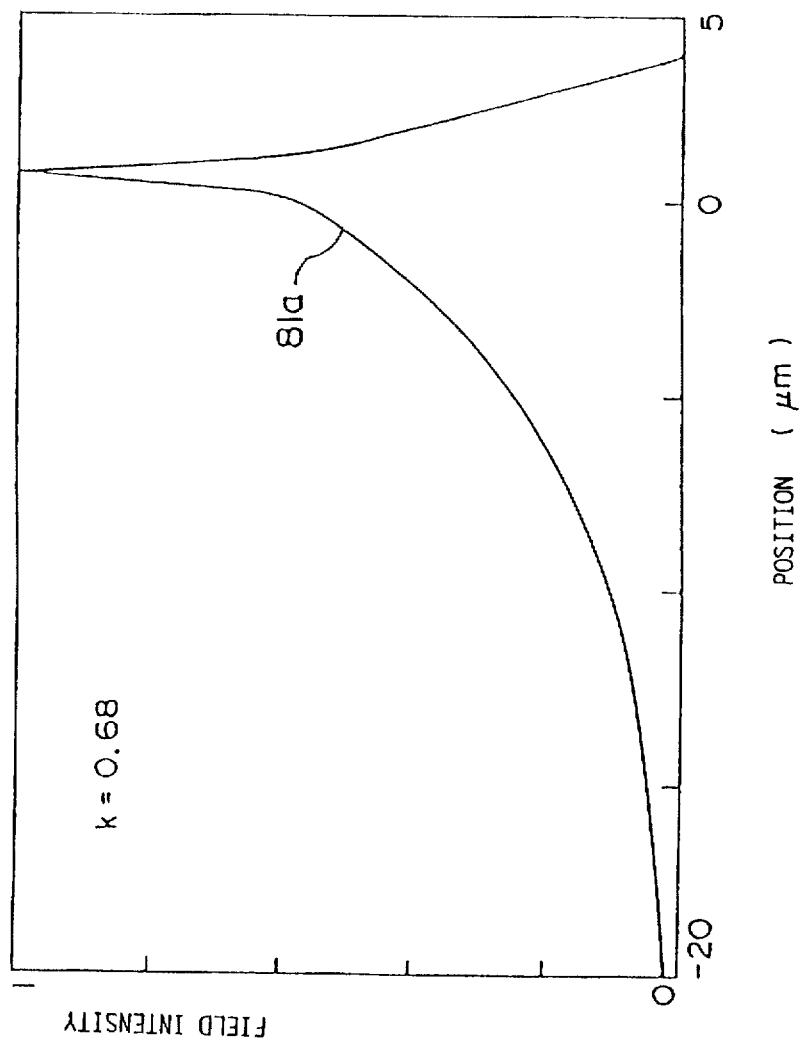
FIG. 11 is a graph showing a result of calculation of field intensity at a beam exiting surface.

FIG. 11 is a graph showing a result of calculation of field intensity at the beam exiting surface 53 when the thickness t12 of the transmission constant reduction enhancing layers 5 and the thickness t13 of the transmission constant reduction enhancing layer 58 are 0.7 μm. The beam diameter is about 5 μm.

Figure 12:
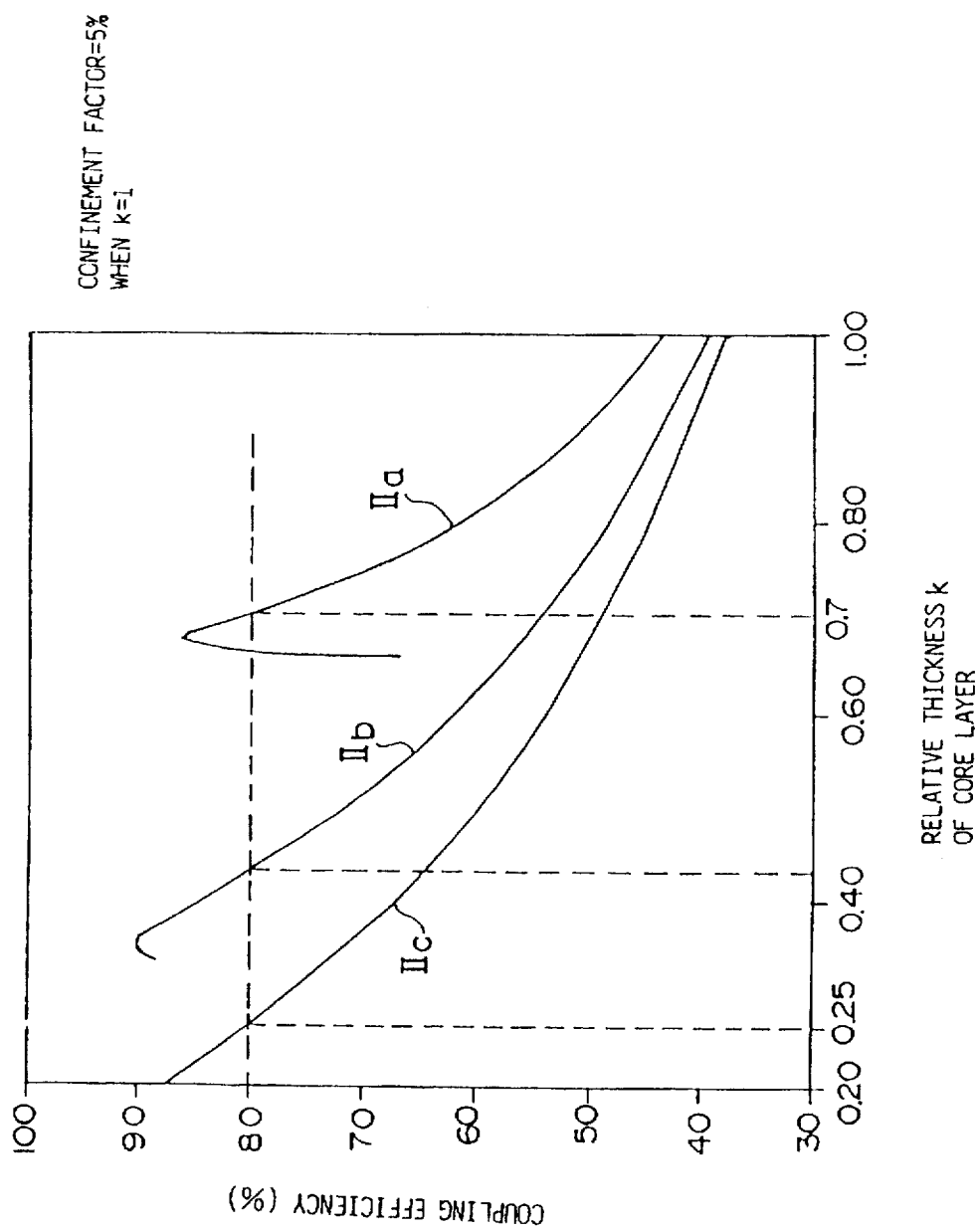
FIG. 12 is a graph showing a coupling efficiency for a case where a laser beam generating the electric field shown in FIG. 11 is coupled to a Gaussian beam having a beam diameter of 10 μm.

FIG. 12 is a graph showing a coupling efficiency for the case where the laser beam generating the electric field shown in FIG. 11 is coupled to a Gaussian beam having a beam diameter of 10 μm when the relative thickness is varied. In FIG. 12, a curve indicated by IIb is obtained when the thickness t12 of the transmission constant reduction enhancing layer 57 and the thickness t13 of the transmission constant reduction enhancing layer 58 are set to 0.2 μm. A curve indicated by IIa is obtained when the thickness t12 of the transmission constant reduction enhancing layer 57 and the thickness t13 of the transmission constant reduction enhancing layer 58 are set to 0.7 μm. A curve indicated by IIc is for the conventional apparatus which does not have the transmission constant reduction enhancing layers 57 and 58. It is appreciated by the graph shown in FIG. 12 that the increasing rate of the beam diameter due to the reduction in the transmission constant $\gamma_{cr}$ is increased and the coupling efficiency is increased when the transmission constant reduction enhancing layers 57 and 58 are present. Additionally, the increasing rate of the beam diameter due to the reduction in the transmission constant $\gamma_{cr}$ is increased and the coupling efficiency is increased as the relative thickness k is increased.

Specifically, in the present embodiment, when the thickness t12 of the transmission constant reduction enhancing layer 57 and the thickness t13 of the transmission constant reduction enhancing layer 58 are set to 0.7 μm, a coupling efficiency of 80% can be achieved by setting the relative thickness to 0.7. In this construction, since the ratio of decrease in the thickness of the tapered portion 54a is about ⅓ of that of the conventional device, strain of the tapered portion 54a is about ⅓ of that of the conventional device when the core layer 54 is formed by the above-mentioned area-selective crystal growth method. Accordingly, the optical semiconductor device 50 has a high reliability as compared to the conventional device.

Additionally, in the present embodiment, since the width of the window 49 can be increased in an area corresponding to the laser beam generating area 51, each layer of the core layer 54 in the laser beam generating area 51 is formed with a uniform thickness. Further the positioning of the mask performed in a mesa etching process becomes easy.

It should be noted that the guiding layers 70 and 73 may be omitted from the core layer 54 if a desired confinement factor is achieved. Additionally, the substrate 55 may be made of InP, InGaAs or InAlAs. If such a substrate is used, a lower cladding layer formed by epitaxially grown InGaAsP may be provided on a surface of the substrate. Further, the core layer 54 may be a bulk-type layer if a thickness thereof is gradually reduced.

In the embodiment shown in FIG. 6A, parts of the layers 56 and 58 above the core layer 54 may be removed to form a slit at a portion corresponding to a boundary between the laser beam generating area 51 and the laser beam diameter changing area 52. The slit functions to prevent a current in the laser beam generating area 51 from being leaked into the laser beam diameter changing area 52. As a result, an operational current is reduced. The slit also provides an effect such that a parasitic capacitance of the device 50 with respect to the electrode 60 is reduced. Thus, the device 50 can be operated at a high speed.

The same effect will be obtained by inverting, instead of forming the slit, the conductivity type of a portion of the upper cladding layer 56 above the laser beam generating area 51 from the conductivity type of a portion of the upper cladding layer 56 above the laser beam diameter changing area 52.

A description will now be given of a second embodiment of the present invention. FIG. 13A is a cross-sectional view of an optical semiconductor device 50A according to the second embodiment of the present invention. In FIG. 13A, parts that are the same as the parts shown in FIGS. 5A, 5B and 6A are given the same reference numerals, and descriptions thereof will be omitted.

The optical semiconductor device 50A is composed of a laser beam generating area 51A and a laser beam diameter changing area 52A. The optical semiconductor device 50A has the same construction as the optical semiconductor device 50 except for the transmission constant reduction enhancing layer 58 being omitted. That is, in the optical semiconductor device 50A, the upper cladding layer 56 is formed on the core layer 54. The transmission constant reduction enhancing layer 57 and the lower clad (substrate) 55 are provided on the lower side of the core layer 54. Accordingly, a distribution of the refractive indexes becomes as shown in FIG. 13B. The optical semiconductor device 50A has a characteristic similar to that of the optical semiconductor device 50, and thus the optical semiconductor device 50A can be coupled to an optical fiber with a high optical coupling efficiency.

A description will now be given of a third embodiment of the present invention. FIG. 14A is a cross-sectional view of an optical semiconductor device 50B according to the third embodiment of the present invention. In FIG. 14A, parts that are the same as the parts shown in FIGS. 5A, 5B and 6A are given the same reference numerals, and descriptions thereof will be omitted.

The optical semiconductor device 50B is composed of a laser beam generating area 51B and a laser beam diameter changing area 52B. The optical semiconductor device 50B has the same construction as the optical semiconductor device 50 except for the transmission constant reduction enhancing layer 57 being omitted. That is, in the optical semiconductor device 50B, the core layer 54 is formed on the lower cladding layer (substrate) 55. The transmission constant reduction enhancing layer 58 and the upper clad 56 are provided on the upper side of the core layer 54. Accordingly, a distribution of the refractive indexes becomes as shown in FIG. 14B. The optical semiconductor device 50B has a characteristic similar to that of the optical semiconductor device 50, and thus the optical semiconductor device 50B can be coupled to an optical fiber with a high optical coupling efficiency.

A description will now be given of a fourth embodiment of the present invention. FIG. 15A is a cross-sectional view of an optical semiconductor device 50C according to the fourth embodiment of the present invention. In FIG. 15A, parts that are the same as the parts shown in FIGS. 5A, 5B and 6A are given the same reference numerals, and descriptions thereof will be omitted.

The optical semiconductor device 50C is composed of a laser beam generating area 51C and a laser beam diameter changing area 52C. The optical semiconductor device 50C has the same construction as the optical semiconductor device 50 except for the transmission constant reduction enhancing layers 57 and 58 being replaced by transmission constant reduction enhancing layers 57A and 58A. The transmission constant reduction enhancing layers 57A and 58A have tapered portions 57Aa and 58Aa, respectively, in the laser beam diameter changing area 52C. A thickness of each of the tapered portions 57Aa and 58Aa is reduced from a thickness t20 to a thickness t21 toward the beam exiting surface 53. A reduction rate of the thickness of each of the tapered portions 57Aa and 58Aa is the same as that of the tapered portion 54a of the core layer 54.

Figure 16:
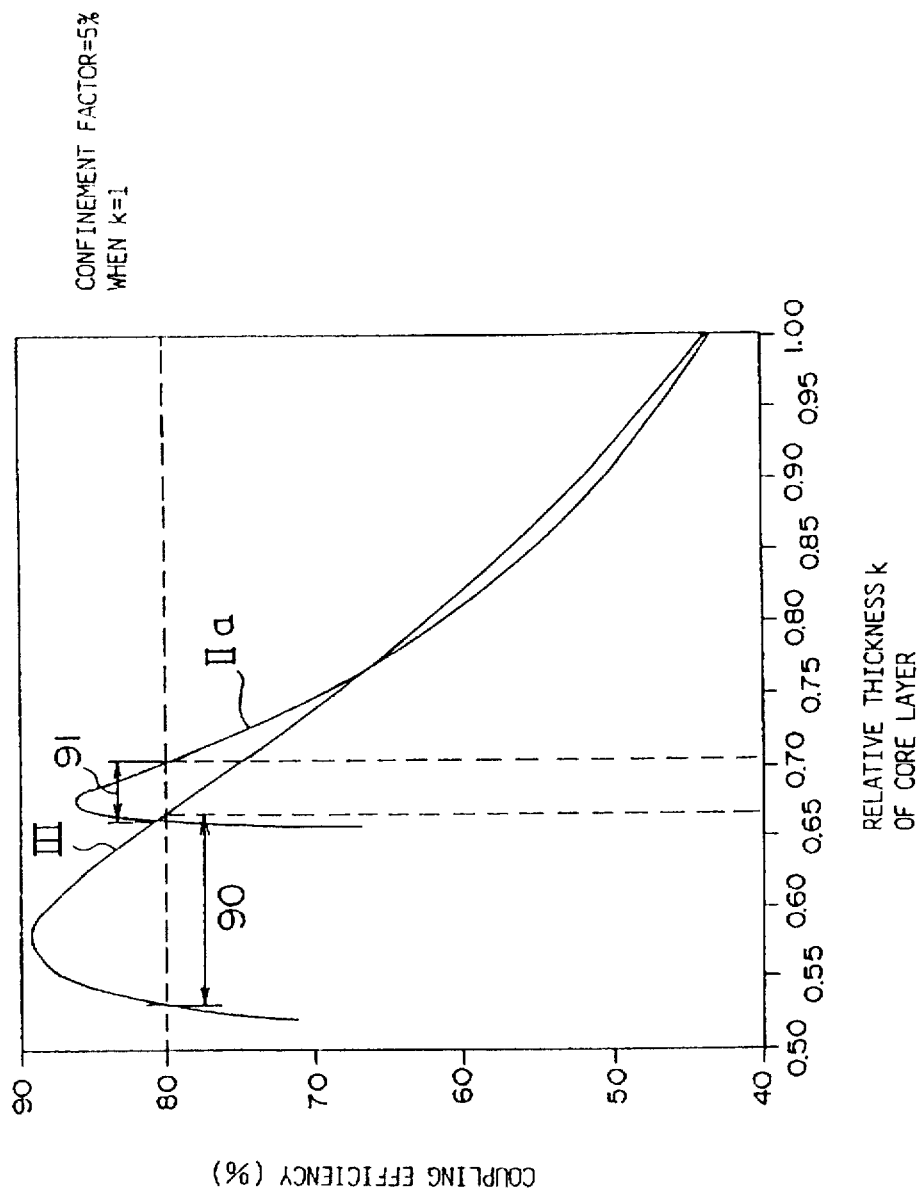
FIG. 16 is a graph showing a variation in a coupling efficiency.

The coupling efficiency was calculated by varying the relative thickness of the core layer 54 and the transmission constant reduction enhancing layers 57A and 58A in the following condition. That is, the thickness t20 is set to 0.8 μm. A thickness of each of the guiding layers 70 and 73 in the laser beam generating area 51C is set to 0.0187 μm. A thickness of the upper cladding layer 56 is set to 2.2 μm. The result of calculation is represented by a curve indicated by III in FIG. 16. In FIG. 16, the curve IIa shown in FIG. 12 is also indicated.

The graph of FIG. 16 shows that the coupling efficiency of 80% is achieved in a range of the relative thickness indicated by a reference numeral 90. The range 90 spans from about 0.53 to 0.67. In the present embodiment, the relative thickness is set to 0.60 which is a center of the range 90. Thus, the optical semiconductor device 50C can be coupled to a single mode optical fiber having a core diameter of 10 μm with the coupling efficiency of about 90%.

In FIG. 16, a range 91 of the relative thickness of the optical semiconductor device 50 is from 0.65 to 0.70 which range is less than the range 90 of the present embodiment. That is, the range 90 is three times greater than the range 90. This means that the present embodiment has a larger allowable tolerance than the first embodiment with respect to the relative thickness. Thus, the optical semiconductor device 50C can be fabricated more easily than the optical semiconductor device 50 of the first embodiment.

A description will now be given of a fifth embodiment of the present invention. FIG. 17A is a cross-sectional view of an optical semiconductor device 50D according to the fifth embodiment of the present invention. In FIG. 17A, parts that are the same as the parts shown in FIG. 15A are given the same reference numerals, and descriptions thereof will be omitted.

The optical semiconductor device 50D is composed of a laser beam generating area 51D and a laser beam diameter changing area 52D. The optical semiconductor device 50D has the same construction as the optical semiconductor device 50C except for the transmission constant reduction enhancing layer 58A being omitted. That is, in the optical semiconductor device 50D, the upper cladding layer 56 is formed on the core layer 54. The transmission constant reduction enhancing layer 57A and the lower clad (substrate) 55 are provided on the lower side of the core layer 54. The transmission constant reduction enhancing layer 57A has the tapered portion 57Aa. Accordingly, a distribution of the refractive indexes becomes as shown in FIG. 17B. The optical semiconductor device 50D has a characteristic similar to that of the optical semiconductor device 50C, and thus the optical semiconductor device 50D can be coupled to an optical fiber with a high optical coupling efficiency. Additionally, the present embodiment has a larger allowable tolerance than the first embodiment with respect to the relative thickness. Thus, the optical semiconductor device 50D can be fabricated more easily than the optical semiconductor device 50 of the first embodiment.

A description will now be given of a sixth embodiment of the present invention. FIG. 18A is a cross-sectional view of an optical semiconductor device 50E according to the sixth embodiment of the present invention. In FIG. 18A, parts that are the same as the parts shown in FIGS. 15A are given the same reference numerals, and descriptions thereof will be omitted.

The optical semiconductor device 50E is composed of a laser beam generating area 51E and a laser beam diameter changing area 52E. The optical semiconductor device 50E has the same construction as the optical semiconductor device 50C except for the transmission constant reduction enhancing layer 57A being omitted. That is, in the optical semiconductor device 50E, the core layer 54 is formed on the lower cladding layer (substrate) 55. The transmission constant reduction enhancing layer 58A and the upper cladding layer 56 are provided on the upper side of the core layer 54. The transmission constant reduction enhancing layer 58A has the tapered portion 58Aa. Accordingly, a distribution of the refractive indexes becomes as shown in FIG. 18B. The optical semiconductor device 50E has a characteristic similar to that of the optical semiconductor device 50C, and thus the optical semiconductor device 50E can be coupled to an optical fiber with a high optical coupling efficiency. Additionally, the present embodiment has a larger allowable tolerance than the first embodiment with respect to the relative thickness. Thus, the optical semiconductor device 50E can be fabricated more easily than the optical semiconductor device 50 of the first embodiment.

Figure 19A:
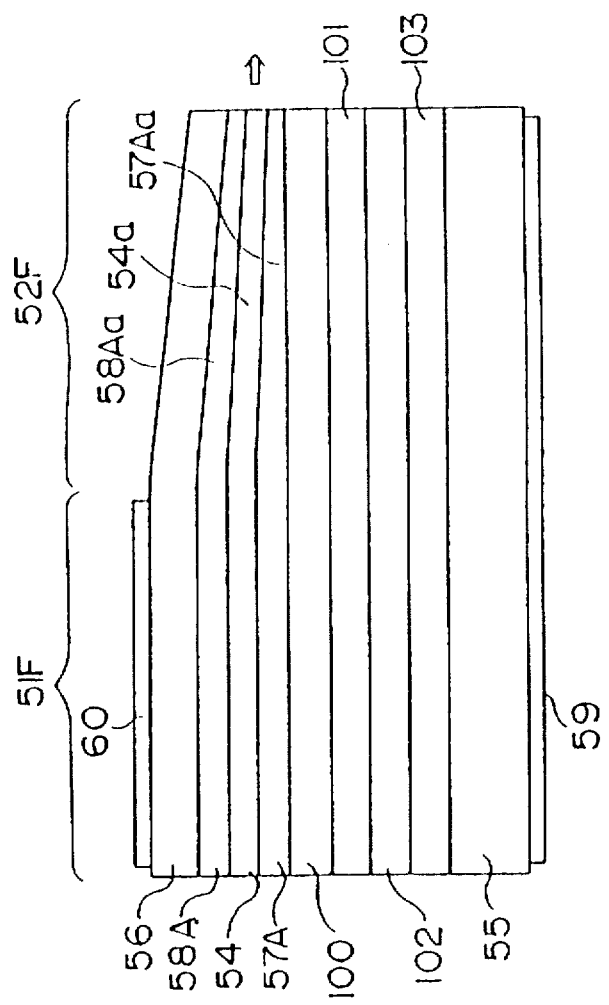
FIG. 19A is a cross-sectional view of an optical semiconductor device according to a seventh embodiment of the present invention.

A description will now be given, with reference to FIGS. 19A to 21, of a seventh embodiment of the present invention. FIG. 19A is a cross-sectional view of an optical semiconductor device 50F according to the seventh embodiment of the present invention. In FIG. 19A, parts that are the same as the parts shown in FIG. 15A are given the same reference numerals, and descriptions thereof will be omitted.

The optical semiconductor device 50F is composed of a laser beam generating area 51F and a laser beam diameter changing area 52F. The optical semiconductor device 50F has the same construction as the optical semiconductor device 50C shown in FIG. 15A except for secondary core layers 101 and 103 being added on the lower side of the core layer 54.

The transmission constant reduction enhancing layer 58A and the upper cladding layer 56 are provided on the upper side of the core layer 54. On the lower side of the core layer 54, there are provided the transmission constant reduction enhancing layer 57A, an InGaAsP lower cladding layer 100, the lower secondary core layer 101, an InGaAs lower cladding layer 102, a lower secondary core layer 103 and the substrate 55, in that order.

Figure 19B:
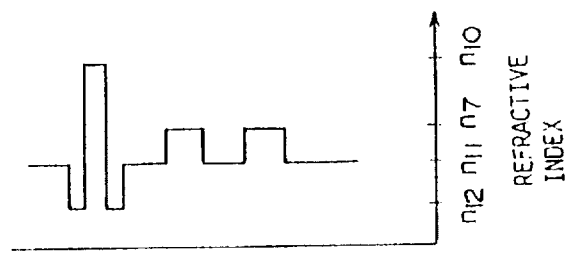
FIG. 19B is an illustration for explaining a distribution of refractive indexes in the optical semiconductor device shown in FIG. 19A.
Figure 20:
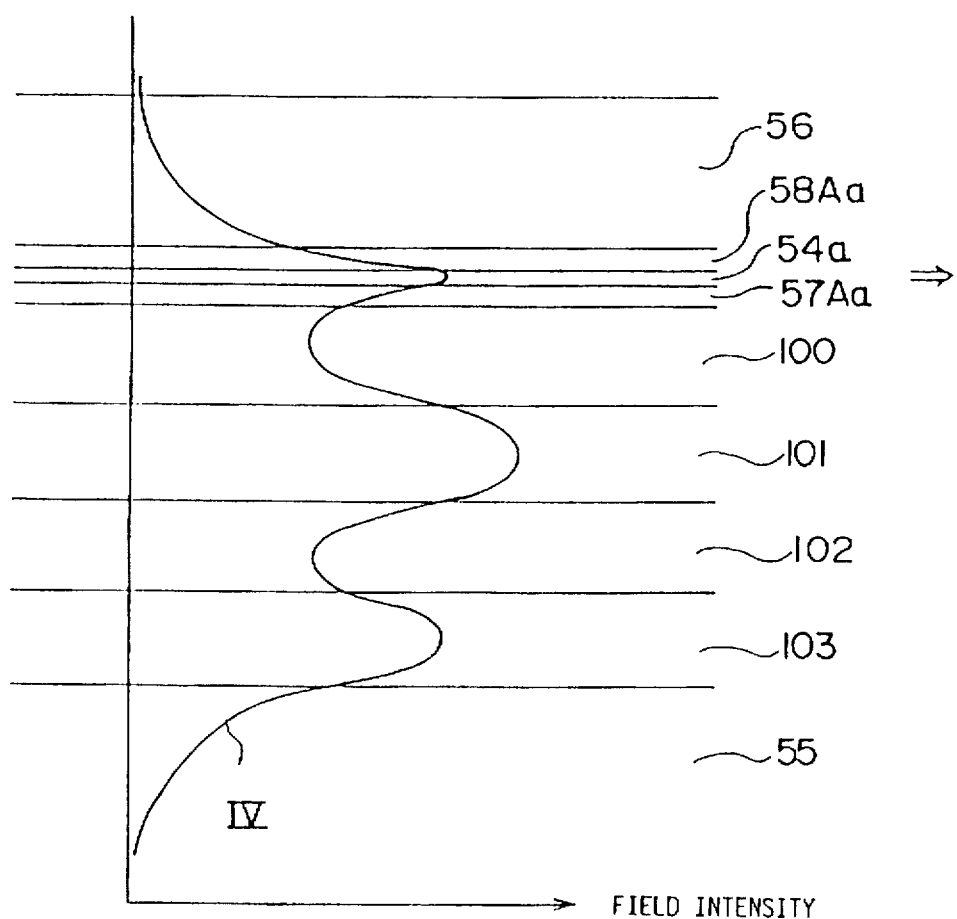
FIG. 20 is a graph showing a field distribution of a laser beam in the optical semiconductor device shown in FIG. 19A.

Each of the lower secondary core layers 101 and 103 is made of InGaAsP and has a band gap energy λg of 0.973 μm. A thickness of each of the lower secondary core layers 101 and 103 is 1.25 μm. A refractive index of each of the layers 101 and 103 is n7. The refractive index n7 is less than the refractive index n10 and greater than the refractive index n11 (n10>n7>n11). A distribution of the refractive indexes in the optical semiconductor device 50F is shown in FIG. 19B.

The lower secondary core layers 101 and 103 has the same function as the secondary core layers 36 shown in FIG. 3B. That is, the lower secondary core layer 101 and 103 attract a part of the laser beam leaking from the core layer 54 toward the transmission constant reduction enhancing layer 57A in the laser beam diameter changing area 52F. Thus, a distribution of the field intensity of the laser beam in the laser beam diameter changing area 52F becomes that indicated by a curve IV in FIG. 20. The field intensity on the lower side of the core layer 54 is extended.

Figure 21:
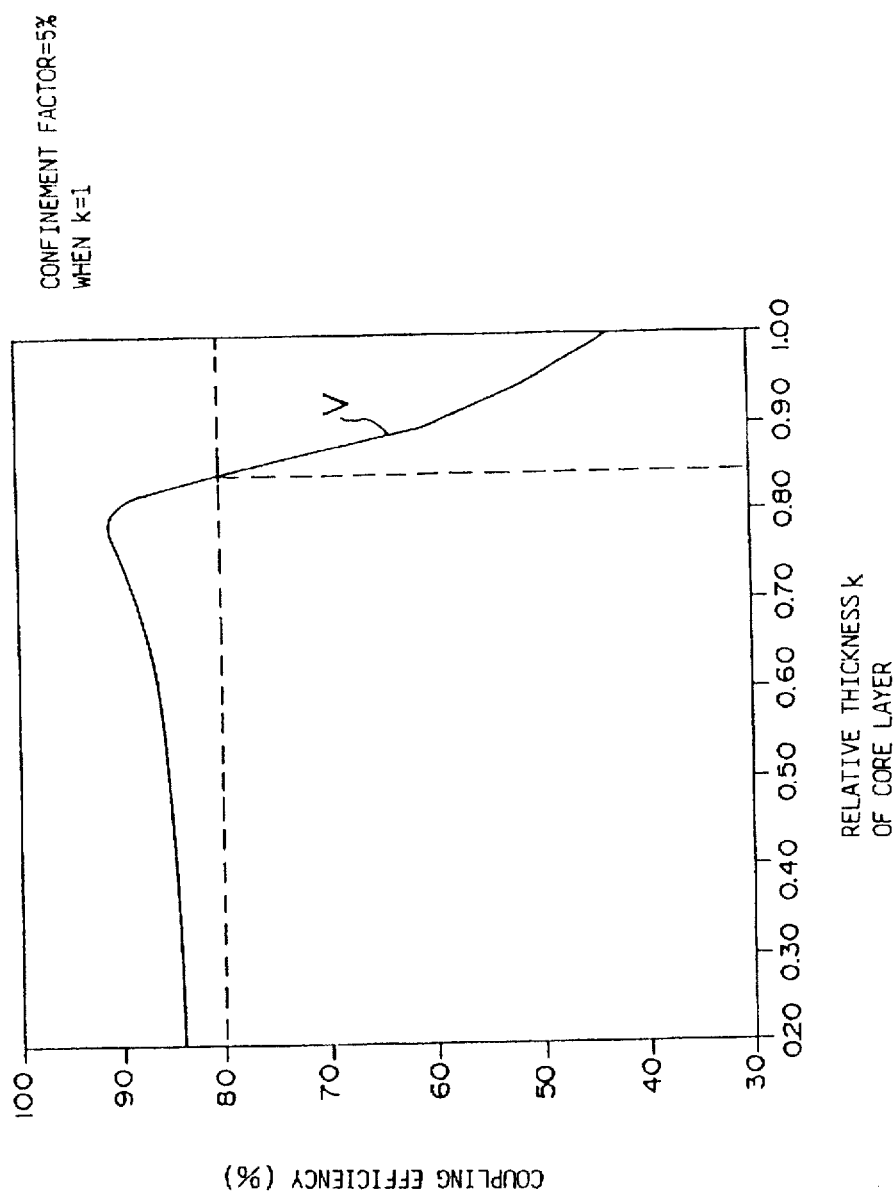
FIG. 21 is a graph showing a variation in a coupling efficiency of the optical semiconductor device shown in FIG. 19A.

The coupling efficiency was calculated by varying the relative thickness of the core layer 54 and the transmission constant reduction enhancing layers 57A and 58A when a thickness of each of the transmission constant decrease layers 57A and 58A in the laser beam generating area 51F is set to 0.5 μm. That is, the thickness t20 is set to 0.8 μm. The result of calculation is represented by a curve indicated by V in FIG. 21. The graph of FIG. 21 shows that a coupling efficiency of greater than 80% is achieved when the relative thickness k is less than about 0.85. Accordingly, in the present embodiment, the relative thickness k of the core layer 54 is set to 0.85.

The relative thickness of 0.85 is greater than the relative thickness k of the first embodiment. Thus, the optical semiconductor device 50F is more improved than that of the optical semiconductor device 50 according to the first embodiment.

A description will now be given, with reference to FIG. 22A, of an eighth embodiment of the present invention. FIG. 22A is a cross-sectional view of an optical semiconductor device 50G according to the eighth embodiment of the present invention. In FIG. 22A, parts that are the same as the parts shown in FIG. 15A are given the same reference numerals, and descriptions thereof will be omitted.

The optical semiconductor device 50G is composed of a laser beam generating area 51G and a laser beam diameter changing area 52G. The optical semiconductor device 50G has the same construction as the optical semiconductor device 50D shown in FIG. 17A except for secondary core layers 101 and 103 being added on the lower side of the core layer 54.

The upper cladding layer 56 is provided on the upper side of the core layer 54. On the lower side of the core layer 54, there are provided the transmission constant reduction enhancing layer 57A, the InGaAsP lower cladding layer 100, the lower secondary core layer 101, the InGaAs lower cladding layer 102, a lower secondary core layer 103 and the substrate 55, in that order. A distribution of the refractive indexes in the optical semiconductor device 50G is shown in FIG. 22B.

The optical semiconductor device 50G has substantially the same performance as the optical semiconductor device 50F.

Figure 23A:
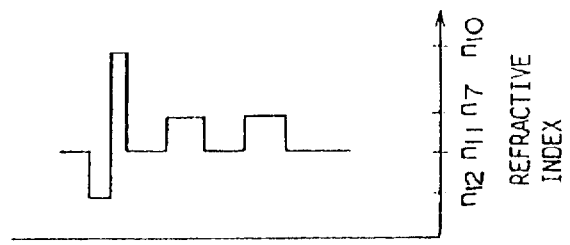
FIG. 23A is a cross-sectional view of an optical semiconductor device according to a ninth embodiment of the present invention.

A description will now be given, with reference to FIG. 23A, of a ninth embodiment of the present invention. FIG. 23A is a cross-sectional view of an optical semiconductor device 50H according to the ninth embodiment of the present invention. In FIG. 23A, parts that are the same as the parts shown in FIG. 15A are given the same reference numerals, and descriptions thereof will be omitted.

The optical semiconductor device 50H is composed of a laser beam generating area 51H and a laser beam diameter changing area 52H. The optical semiconductor device 50H has the same construction as the optical semiconductor device 50E shown in FIG. 18A except for secondary core layers 101 and 103 being added on the lower side of the core layer 54.

Figure 23B:
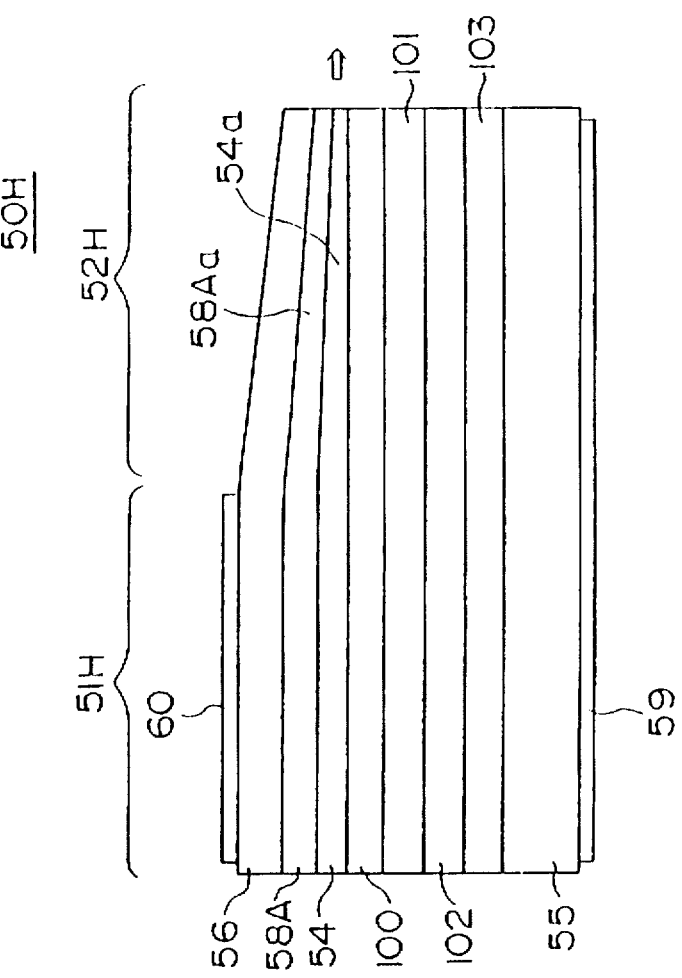
FIG. 23B is an illustration for explaining a distribution of refractive indexes in the optical semiconductor device shown in FIG. 23A.

The transmission constant reduction enhancing layer 58A and the upper cladding layer 56 are provided on the upper side of the core layer 54. On the lower side of the core layer 54, there are provided the InGaAsP lower cladding layer 100, the lower secondary core layer 101, the InGaAs lower cladding layer 102, a lower secondary core layer 103 and the substrate 55, in that order. A distribution of the refractive indexes in the optical semiconductor device 50H is shown in FIG. 23B.

The optical semiconductor device 50H has substantially the same performance as the optical semiconductor device 50F.

A description will now be given, with reference to FIG. 24A, of a tenth embodiment of the present invention. FIG. 24A is a cross-sectional view of an optical semiconductor device 50I according to the tenth embodiment of the present invention. In FIG. 24A, parts that are the same as the parts shown in FIG. 6A are given the same reference numerals, and descriptions thereof will be omitted.

The optical semiconductor device 50I is composed of a laser beam generating area 51I and a laser beam diameter changing area 52I. The optical semiconductor device 50I has the same construction as the optical semiconductor device 50 shown in FIG. 6A except for secondary core layers 101 and 103 being added on the lower side of the core layer 54.

The transmission constant reduction enhancing layer 58 and the upper cladding layer 56 are provided on the upper side of the core layer 54. On the lower side of the core layer 54, there are provided the transmission constant reduction enhancing layer 57, the InGaAsP lower cladding layer 100, the lower secondary core layer 101, the InGaAsP lower cladding layer 102, a lower secondary core layer 103 and the substrate 55, in that order. It should be noted that the thickness of each of the transmission constant reduction enhancing layers 57 and 58 is uniform over an entire length. A distribution of the refractive indexes in the optical semiconductor device 50I is shown in FIG. 24B.

The optical semiconductor device 50I has substantially the same performance as the optical semiconductor device 50F.

When the confinement factor is set to 5%, the relative thickness k is increased above 0.8 in the device 50I according to the present embodiment or the device 50F according to the seventh embodiment shown in FIG. 19A. Thus, if a smaller relative thickness k is used for the present embodiment or the seventh embodiment, a larger confinement factor can be realized. When the optical semiconductor device 50I is used for a laser diode, a threshold current for laser oscillation can be decreased by increasing the confinement factor.

FIG. 25 is a graph showing a result of calculation of the coupling efficiency when the confinement factor of the core layer 54 in the laser beam generating area is increased to 7.5%. The confinement factor is increased by providing seven multiple quantum well layers in the core layer 54 and setting the thickness of each of the guiding layers 57 and 59, the barrier layers 71 and the well layers 72 to an appropriate value. In FIG. 25, a curve indicated by Va corresponds to the confinement factor of 7.5% in the laser beam generating area of the present embodiment, and a curve indicated by VI corresponds to the confinement factor of 7.5% in the laser beam generating area of the seventh embodiment shown in FIG. 19A. As shown inn FIG. 25, in the present embodiment, even if the confinement factor of the laser beam generating area is increased to 7.5%, the coupling efficiency of more than 80% can be achieved by decreasing the relative thickness to about 0.75.

As mentioned above, when the confinement factor of the laser beam generating area is increased, the extent of an interaction between the core layer and the laser beam is increased. Thus, in a laser apparatus, the threshold current for oscillation is decreased and output efficiency and the temperature characteristic are improved. Additionally, in an optical amplifier, a large amplification can be obtained. Further, in an optical modulator, an increased modulation efficiency and a large modulation frequency can be obtained. In a photodetecting device, external quantum efficiency can be improved and a high-speed response can be achieved due to a decrease in a parasitic capacitance.

A description will now be given, with reference to FIG. 26A, of an eleventh embodiment of the present invention. FIG. 26A is a cross-sectional view of an optical semiconductor device 50J according to the eleventh embodiment of the present invention. In FIG. 26A, parts that are the same as the parts shown in FIG. 13A are given the same reference numerals, and descriptions thereof will be omitted.

The optical semiconductor device 50J is composed of a laser beam generating area 51J and a laser beam diameter changing area 52J. The optical semiconductor device 50J has the same construction as the optical semiconductor device 50A shown in FIG. 13A except for secondary core layers 101 and 103 being added on the lower side of the core layer 54.

The upper cladding layer 56 is provided on the upper side of the core layer 54. On the lower side of the core layer 54, there are provided the transmission constant reduction enhancing layer 57, the InGaAsP lower cladding layer 100, the lower secondary core layer 101, the InGaAs lower cladding layer 102, a lower secondary core layer 103 and the substrate 55, in that order. A distribution of the refractive indexes in the optical semiconductor device 50J is shown in FIG. 25B.

The optical semiconductor device 50J has substantially the same performance as the optical semiconductor device 50I.

A description will now be given, with reference to FIG. 27A, of a twelfth embodiment of the present invention. FIG. 27A is a cross-sectional view of an optical semiconductor device 50K according to the twelfth embodiment of the present invention. In FIG. 27A, parts that are the same as the parts shown in FIG. 13A are given the same reference numerals, and descriptions thereof will be omitted.

The optical semiconductor device 50K is composed of a laser beam generating area 51K and a laser beam diameter changing area 52K. The optical semiconductor device 50K has the same construction as the optical semiconductor device 50B shown in FIG. 14A except for secondary core layers 101 and 103 being added on the lower side of the core layer 54.

The transmission constant reduction enhancing layer 58 and the upper cladding layer 56 are provided on the upper side of the core layer 54. On the lower side of the core layer 54, there are provided the InGaAsP lower cladding layer 100, the lower secondary core layer 101, the InGaAs lower cladding layer 102, a lower secondary core layer 103 and the substrate 55, in that order. A distribution of the refractive indexes in the optical semiconductor device 50K is shown in FIG. 27B.

The optical semiconductor device 50L has substantially the same performance as the optical semiconductor device 50J.

A description will now be given, with reference to FIG. 28A, of a thirteenth embodiment of the present invention. FIG. 28A is a cross-sectional view of an optical semiconductor device 50L according to the thirteenth embodiment of the present invention. In FIG. 28A, parts that are the same as the parts shown in FIG. 6A are given the same reference numerals, and descriptions thereof will be omitted.

The optical semiconductor device 50L is composed of a laser beam generating area 51L and a laser beam diameter changing area 52L. The optical semiconductor device 50L has the same construction as the optical semiconductor device 50 shown in FIG. 6A except for a reflector 110 being formed between the lower cladding layer (substrate) 55 and the lower transmission constant reduction enhancing layer 57. A distribution of the refractive indexes in the optical semiconductor device 50L is shown in FIG. 28B. The thickness of each of the transmission constant reduction enhancing layers 57 and 58 is set to 0.2 µm. The thickness of the guiding layers is set to 0.0284 µm. The thickness of the upper cladding layer is set to 2.8 µm. Additionally, a periodic concave-convex structure 110 is formed on the boundary between the lower cladding layer 55 and the lower transmission constant reduction enhancing layer 57. This periodic concave-convex structure is hereinafter referred to as a diffraction-grating 110. The spacing of the protuberances forming the diffraction-grating 110 is equal to a half of the output light wavelength of the device. The spacing of the protuberances forming the diffraction-grating 110 is hereinafter referred to as a ½ wavelength shifted spacing with respect to a wavelength of the output light. If the spacing is a quarter of the output light wavelength, it is referred to as a ¼ wavelength shifted spacing.

In this embodiment, the core layer 54 has a uniform thickness t10 in the laser beam generating area 51L. The diffraction-grating 110 is a part of the laser beam generating area 51L, and formed between the lower cladding layer 55 and the lower transmission constant reduction enhancing layer 57. The diffraction-grating 110 is formed by an interference exposure method and a dry or wet etching. The diffraction-grating has a pitch of 0.24 µm and a depth of 0.24 µm.

In the present embodiment, the coupling factor of the diffraction-grating type reflector 110 is 40 cm$^{-1}$. This coupling factor of 40 cm$^{-1}$ is sufficient for functioning the laser beam generating area 11 as a distribution feedback type laser oscillator. In the distribution feedback type semiconductor laser, a layer, which is provided for forming the diffraction-grating type reflector, prevents the transmission constant from being decreased. However, in the present embodiment, since the diffraction-grating is provided on the boundary between the lower cladding layer 55 and the lower transmission constant reduction enhancing layer 57, such a problem is eliminated.

If the diffraction-grating is formed on a boundary between the lower cladding layer 34 and the secondary core layer 36 in the conventional optical semiconductor device 30 shown in FIG. 3B, the coupling factor of the diffraction-grating type reflector becomes as small as less than a few cm$^{-1}$. Thus, it is difficult to fabricate a distribution feedback type laser oscillator by using such a diffraction grating.

The distributed feedback type laser oscillator according to the present invention has an advantage in that a coupling of a laser beam and an optical fiber or a coupling of a laser beam and a pin junction optical waveguide is easily achieved when a light source emitting a light beam having a specific wavelength such as a laser for a wavelength division multiplexing (WDM) optical fiber transmission system is fabricated. This is because the distributed feedback laser oscillator has a constant oscillation wavelength.

Additionally, if the laser beam generating area 51L is formed as the distributed feedback type laser, other characteristics is improved. That is, the threshold current for laser oscillation is decreased; efficiency of light emission is increased; and temperature characteristics are improved.

It should be noted that the above-mentioned diffraction grating 110 can also be applied to the optical semiconductor devices 50A, 50C, 50D, 50F, 50G, 50I and 50J so that the laser beam generating areas of those optical semiconductor devices function as the distribution feedback type laser oscillator.

A description will now be given, with reference to FIG. 29A, of a fourteenth embodiment of the present invention. FIG. 29A is a cross-sectional view of an optical semiconductor device 50M according to the fourteenth embodiment of the present invention. In FIG. 29A, parts that are the same as the parts shown in FIG. 6A are given the same reference numerals, and descriptions thereof will be omitted.

The optical semiconductor device 50M is composed of a laser beam generating area 51M and a laser beam diameter changing area 52M. The optical semiconductor device 50M has the same construction as the optical semiconductor device 50 shown in FIG. 6A except for a reflector 111 being formed between the upper cladding layer 56 and the upper transmission constant reduction enhancing layer 58. A distribution of the refractive indexes in the optical semiconductor device 50L is shown in FIG. 29B. The optical semiconductor device 50M has the same characteristics as the above-mentioned optical semiconductor device 50L shown in FIG. 28A.

It should be noted that the diffraction-grating 111 can also be applied to the optical semiconductor devices 50C, 50E, 50F, 50H, 50I and 50K so that the laser beam generating areas of those optical semiconductor devices function as the distribution feedback type laser oscillator.

A description will now be given, with reference to FIG. 30A, of a fifteenth embodiment of the present invention. FIG. 30A is a cross-sectional view of an optical semiconductor device 50N according to the fifteenth embodiment of the present invention. In FIG. 30A, parts that are the same as the parts shown in FIG. 6A are given the same reference numerals, and descriptions thereof will be omitted.

The optical semiconductor device 50N is specifically a light receiving element. A laser beam entering surface 120 is formed on an end of the optical semiconductor device 50N. The optical semiconductor device 50N is composed of a photo-sensitive area 51N and a laser beam diameter changing area 52N. The optical semiconductor device 50N has the same construction as the optical semiconductor device 50 shown in FIG. 6A.

The photo-sensitive area 51N has a double hetero pin junction structure. A power source 121 supplies a voltage in a reverse direction with respect to that of the power source 61 shown in FIG. 6A. Accordingly, an electric field is applied to the core layer 54 of the photo-sensitive area 51N so that the device 50N functions as a photodetector. Considering the reversibility of a direction of optical coupling, the optical semiconductor device 50N can be coupled to a single mode optical fiber with coupling efficiency of 80%.

A description will now be given, with reference to FIG. 31A, of a sixteenth embodiment of the present invention. FIG. 31A is a cross-sectional view of an optical semiconductor device 50P according to the sixteen embodiment of the present invention. In FIG. 31A, parts that are the same as the parts shown in FIG. 28A are given the same reference numerals, and descriptions thereof will be omitted.

The optical semiconductor device 50P is specifically a semiconductor laser having a laser beam modulator and a laser beam diameter increasing unit. The optical semiconductor device 50P is composed of a laser beam generating area 51P, a laser beam diameter changing area 52P and a laser beam modulating area 130 provided between the laser beam generating area 51P and the laser beam diameter changing area 52P. That is, the optical semiconductor device 50P has the same construction as the optical semiconductor device 50L shown in FIG. 28A except for the laser beam modulating area 130 being added between the laser beam generating area 51L and the laser beam diameter changing area 52L.

The laser beam modulating area 130 has a double hetero pin junction structure. The core layer 54 has a uniform thickness in the laser beam modulating area 130. A separate electrode 131 is provided on a top surface of the upper cladding layer 56 in the laser beam modulating area 130. A modulation power source 132 is connected between the electrode 130 and the electrode 59 which is provided on a bottom surface of the lower cladding layer 55. A modulation voltage is applied to the core layer 54 via the electrodes 131 and 59. By applying the modulation voltage, an absorption coefficient of the core layer 54 can be changed due to a quantum confinement Stark effect. Thus, a laser beam generated in the laser beam generating area 51P is subjected to an intensity modulation when the laser beam passes through the laser beam modulating area 130. A diameter of the modulated laser beam is then increased when the modulated laser beam passes through the laser beam diameter changing area 52P.

Therefore, the coupling efficiency between the optical semiconductor device 50P and a single-mode optical fiber is improved.

It should be noted that a refractive index of the core layer can be varied proportional to the modulation voltage due to the quantum confinement Stark effect when a transparent range of the core layer 54 in the laser beam modulating area 130 is used. In order to do this, a wavelength of the laser beam generated in the laser beam generating area 51P is set to be greater than a wavelength of the band gap energy of the core layer 54 in the laser beam modulating area 130. In this case, the optical semiconductor device 50P can be used as a phase modulator.

The same advantage can be achieved if the diffraction grating 110 is formed between the upper transmission decrease enhancing layer 58 and the upper cladding layer 56 as shown in FIG. 29A.

A description will now be given, with reference to FIG. 32A, of a seventeenth embodiment of the present invention. FIG. 32A is a cross-sectional view of an optical semiconductor device 50Q according to the seventeenth embodiment of the present invention. In FIG. 32A, parts that are substantially the same as the parts shown in FIG. 30A are given the same reference numerals, and descriptions thereof will be omitted.

The optical semiconductor device 50Q is specifically a traveling-wave type optical amplifier for amplifying a laser beam incident via an end surface thereof. The optical semiconductor device 50Q has antireflection films 141 and 142 on the opposite sides 53a thereof. A silicon oxide film or a silicon nitride film having a thickness equal to quarter of wavelength of the light to be amplified by the semiconductor device 50Q may be used as the antireflection films 141 and 142. The optical semiconductor device 50Q is composed of an optical amplifying area 51Q, and laser beam diameter changing areas 52Q-1 and 52Q-2 which interpose the optical amplifying area 51Q therebetween. The optical amplifying area 51Q has a double hetero pin junction structure. The optical amplifying area 51Q amplifies a laser beam when a current is supplied by the power source 61 in a normal direction.

The optical semiconductor device 50Q may be situated, for example, between an optical fiber and another optical fiber so as to amplify a laser beam that is emitted from an optical fiber and incident on another optical fiber. The optical semiconductor device 50Q can be coupled to the respective optical fibers with a high coupling efficiency, since the device has the laser beam diameter changing areas 52Q-1 and 52Q-2. Therefore, the large overall, fiber-to-fiber gain can be realized.

A description will now be given, with reference to FIG. 33A, of an eighteenth embodiment of the present invention. FIG. 33A is a cross-sectional view of an optical semiconductor device 50R according to the eighteenth embodiment of the present invention. In FIG. 33A, parts that are substantially the same as the parts shown in FIG. 32A are given the same reference numerals, and descriptions thereof will be omitted.

The optical semiconductor device 50R is specifically an optical modulator for modulating a laser beam incident via an end surface thereof. The optical semiconductor device 50R has antireflection films 141 and 142 on the opposite sides 53a thereof. The optical semiconductor device 50R is composed of an optical modulation area 51R, and laser beam diameter changing areas 52R-1 and 52R-2 which interpose the optical modulation area 51R therebetween. The optical modulation area 51R has a double hetero pin junction structure. The optical modulation area 51R modulates a laser beam when a modulation voltage is supplied to the core layer 54 by the modulation power source 132.

The optical semiconductor device 50R may be situated, for example, between an optical fiber and another optical fiber so as to modulate a laser beam that is emitted from an optical fiber and incident on another optical fiber. The optical semiconductor device 50R can be coupled to the respective optical fibers with a high coupling efficiency, since the device has the laser beam diameter changing areas 52R-1 and 52R-2.

It should be noted that if a wavelength of the laser beam is selected to a predetermined range similarly to that of the sixteenth embodiment shown in FIG. 31A, the optical semiconductor device 50R functions as a phase modulator.

A description will now be given, with reference to FIG. 34A, of an nineteenth embodiment of the present invention. FIG. 34A is a cross-sectional view of an optical semiconductor device 50S according to the nineteenth embodiment of the present invention. In FIG. 34A, parts that are substantially the same as the parts shown in FIG. 32A are given the same reference numerals, and descriptions thereof will be omitted.

The optical semiconductor device 50S is specifically a semiconductor laser which oscillates a laser beam. The optical semiconductor device 50S has opposite surfaces 150 and 151 which correspond to the cleaved facet 53m. The optical semiconductor device 50S is composed of a laser beam generating area 51S, and laser beam diameter changing areas 52S-1 and 52S-2 which interpose the laser beam generating area 51S therebetween. The optical amplifying area 51S has a double hetero pin junction structure. The laser beam generating area 51S generates a laser beam when a current is supplied by the power source 61 in a normal direction of the pin junction. The laser beam generated in the laser beam generating area 51S is emitted from both of the opposite surfaces 150 and 151 via the respective laser beam diameter changing areas 52S-1 and 52S-2. Due to the laser beam diameter changing areas 52S-1 and 52-S2, the laser optical semiconductor device 50S can be connected to optical fibers with a high coupling efficiency.

Additionally, the optical semiconductor device 50S has an advantage in that a high output operation can be performed as compared to a device which does not have the beam diameter changing areas 52S-1 and 52S-2. The reason is explained below. If an energy of the laser beam increased beyond a specific value, the end surfaces may be destroyed. Accordingly, it is difficult for the conventional semiconductor laser, which does not have the beam diameter changing area 52S-1 and 52S-2, to operate with a high output. However, in the present embodiment, the energy density at the end surfaces 150 and 151 is decreased since the spot size of the laser beam that propagated the beam diameter changing area and reached the end surfaces 150 and 151 is spread. Thus, the semiconductor device according to the present embodiment can be operated with a higher output than the conventional device.

A description will now be given, with reference to FIG. 35A, of a twentieth embodiment of the present invention. FIG. 35A is a cross-sectional view of an optical semiconductor device 50T according to the twentieth embodiment of the present invention. In FIG. 35A, parts that are substantially the same as the parts shown in FIG. 32A or 33A are given the same reference numerals, and descriptions thereof will be omitted.

The optical semiconductor device 50T has opposite surfaces having the antireflection films 140 and 141 on the opposite end surfaces 53a. The optical semiconductor device 50T is composed of an active area 51T, and laser beam diameter changing areas 52T-1 and 52T-2 which interpose the active area 51T therebetween. The active area 51T has a double hetero pin junction structure. The electrode 60 is provided on a top surface of the upper cladding layer 56 in the active area. Additionally, a diffraction-grating 160 is formed between the lower transmission constant reduction enhancing layer 57 and the lower cladding layer 55. This diffraction-grating has a portion in which the spacing of the protuberances forming the diffraction-grating is set to ¼ wavelength of an input or output laser beam at the center of the diffraction-grating as shown in FIG. 35C. The diffraction-grating of this type is hereinafter referred to as a ¼ wavelength shifted diffraction-grating. A diffraction-grating 161 shown in FIG. 35D may be used as the ¼ wavelength shifted diffraction-grating of the optical semiconductor device 50T. The optical semiconductor device 50T can also be coupled to optical fibers with a high coupling efficiency, since the device has the laser beam diameter changing areas 52T-1 and 52T-2.

If the power source 61 is connected between the electrodes 59 and 60 to supply a current to the active area 51T in a normal direction with respect to the junction in the active area, the active area 51T functions as a laser beam amplifier and the band-pass filter. Alternatively, if the modulation voltage power source 132 is connected between the electrodes 59 and 60 to generate an electric field in the core layer in the active area 51T, the active area 51T functions as a laser beam modulator and a band-pass filter. Accordingly, since the optical semiconductor device 50T according to the present embodiment has a band-pass filter therein, the optical semiconductor device 50T is suitable for an optical modulation or an optical amplification in multiple wavelength communications.

It should be noted that the same advantage may be achieved if the ¼ wavelength shift diffraction-grating is formed between the upper transmission constant reduction enhancing layer 58 and the upper cladding layer 56.

A description will now be given, with reference to FIG. 36, of a twenty-first embodiment of the present invention. FIG. 36 is a cross-sectional view of an optical semiconductor device 50V according to the twenty-first embodiment of the present invention. In FIG. 36, parts that are the same as the parts shown in FIG. 6A are given the same reference numerals, and descriptions thereof will be omitted.

In this embodiment, a top surface of the upper cladding layer 56-1 is formed as a horizontal plane. That is, the upper cladding layer 56-1 has a thickness which is gradually increased toward the end surface from which a laser beam exits. Accordingly, the laser beam leaking from the core layer 54a spreads in the thickened portion of the upper cladding layer 56-1. This results in an increase in a beam diameter of the laser beam exiting from the end surface of the optical semiconductor device.

A description will now be given, with reference to FIG. 37, of a twenty-second embodiment of the present invention. FIG. 37 is a cross-sectional view of an optical semiconductor device 50W according to the twenty-second embodiment of the present invention. In FIG. 37, parts that are the same as the parts shown in FIG. 6A are given the same reference numerals, and descriptions thereof will be omitted.

In this embodiment, the electrode 60-1 formed on the upper cladding layer 56 is extended to a part of the laser beam diameter changing area 52W. The part of the laser beam diameter changing area 52W adjacent to the laser beam generating area 51W, which is relatively a thick portion, has a relatively large absorption rate of the laser beam generated in the laser beam generating area 51W. However, if the electrode on the upper cladding layer is extended as in the present embodiment so as to supply a current following in a normal direction, the optical absorption rate can be decreased.

A description will now be given, with reference to FIG. 38, of a twenty-third embodiment of the present invention. FIG. 38 is a cross-sectional view of an optical semiconductor device 50X according to the twenty-third embodiment of the present invention. In FIG. 38, parts that are the same as the parts shown in FIG. 6A are given the same reference numerals, and descriptions thereof will be omitted.

The optical semiconductor device 50X has the same structure as the optical semiconductor device 50 except for an extending portion 170 being added on the beam exiting side. A thickness of each layer in the extending portion is uniform. That is, the thickness of the core layer 54 is maintained to be in a decreased state in the extending portion 170.

If a decreasing rate of the thickness of the core layer 54 is large, the laser beam transmitting through the laser beam diameter changing area reaches the beam exiting surface before the diameter converges a beam diameter inherent to the thickness of the core layer 54. This may causes problems such that an optical transmission loss is increased or the diameter of the laser beam is not expanded to a desired degree. However, if the extending portion 170 is formed as in the present embodiment, the above-mentioned problems will be eliminated.

It should be noted that, in the above-mentioned various embodiments, the thickness decreasing portions 54a, 57Aa or 58Aa may have a construction in which the thickness is not continuously decreased but is stepwisely decreased.

The present invention is not limited to the specifically disclosed embodiments, and variations and modifications may be made without departing from the scope of the present invention.

What is claimed is:

1. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having said second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer being provided between said core layer and said lower cladding layer; and a portion of said transmission constant reduction enhancing layer in said second area having a thickness gradually decreasing toward said first end surface of said optical semiconductor device.

2. The optical semiconductor device as claimed in claim 1, further comprising a secondary core layer provided between said transmission constant reduction enhancing layer and said lower cladding layer, said secondary core layer having a fourth refractive index less than said first refractive index and greater than said second refractive index.

3. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having said second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer being provided between said core layer and said upper cladding layer; and a portion of said transmission constant reduction enhancing layer in said second area has a thickness gradually decreasing toward said first end surface of said optical semiconductor device.

4. The optical semiconductor device as claimed in claim 3, further comprising a secondary core layer provided between said core layer and said lower cladding layer, said secondary core layer having a fourth refractive index less than said first refractive index and greater than said second refractive index.

5. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having said second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer including a lower transmission constant reduction enhancing layer and an upper transmission constant reduction enhancing layer, said lower transmission constant reduction enhancing layer provided between said core layer and said lower cladding layer, said upper transmission constant reduction enhancing layer provided between said core layer and said upper cladding layer; and a portion of each of said lower transmission constant reduction enhancing layer and said upper transmission constant reduction enhancing layer in said second area has a thickness gradually decreasing toward said first end surface of said optical semiconductor device.

6. The optical semiconductor device as claimed in claim 5, further comprising a secondary core layer provided between said lower transmission constant reduction enhancing layer and said lower cladding layer, said secondary core layer having a fourth refractive index less than said first refractive index and greater than said second refractive index.

7. The optical semiconductor device as claimed in one of claims 1, 3, 5, wherein the layered structure in said first area corresponds to a double hetero pin junction structure in which said core layer is an intrinsic layer; and a first electrode is provided on a top surface of said optical semiconductor device in said first area and a second electrode is provided on a bottom surface of said optical semiconductor device so that a voltage is supplied across said core layer in said first portion via said first electrode and said second electrode.

8. The optical semiconductor device as claimed in one of claims 1, 3, 5, wherein the layered structure in said first area corresponds to a double hetero pin junction structure in which said core layer is an intrinsic layer;

an optical reflector being provided on each of said first end surface and said second end surface; and a first electrode being provided on a top surface of said optical semiconductor device in said first area and a second electrode being provided on a bottom surface of said optical semiconductor device so that a current is supplied across said core layer in said first portion via said first electrode and said second electrode.

9. The optical semiconductor device as claimed in one of claims 1, 3, 5, wherein the layered structure in said first area corresponds to a double hetero pin junction structure in which said core layer is an intrinsic layer; and a first electrode is provided on a top surface of said optical semiconductor device in said first area and a second electrode is provided on a bottom surface of said optical semiconductor device so that an electric field is generated in said core layer in said first area by supplying a voltage across said first electrode and said second electrode.

10. The optical semiconductor device as claimed in one of claims 1, 3, 5, further comprising a third area having the same structure as said second area, said third area provided on an opposite side with respect to said first area so that said second end surface corresponds to an end surface of said third area which is remote from said first area, the layered structure in said first area corresponding to a double hetero pin junction structure in which said core layer is an intrinsic layer, a first electrode being provided on a top surface and a second electrode being provided on a bottom surface in said first area, a laser beam passing through said first area being amplified by a current supplied via said first electrode and said second electrode.

11. The optical semiconductor device as claimed in one of claims 1, 3, 5, further comprising a third area having the same structure as said second area, said third area provided on an opposite side with respect to said first area so that said second end surface corresponds to an end surface of said third area which is remote from said first area, the layered structure in said first area corresponding to a double hetero pin junction structure in which said core layer is an intrinsic layer, a first electrode being provided on a top surface and a second electrode being provided on a bottom surface in said first area, a laser beam passing through said first area being modulated by an electric field generated by a voltage supplied across said first electrode and said second electrode.

12. The optical semiconductor device as claimed in one of claims 1, 3, 5, further comprising a third area having the same structure as said second area, said third area provided on an opposite side with respect to said first area so that said second end surface corresponds to an end surface of said third area which is remote from said first area, the layered structure in said first area corresponding to a double hetero pin junction structure in which said core layer is an intrinsic layer, an optical reflector being provided on each of said first end surface and said second end surface, a first electrode being provided on a top surface and a second electrode being provided on a bottom surface in said first area, a laser beam being generated in said core layer in said first area by supplying a current via said first electrode and said second electrode, the laser beam exiting from each of said first end surface and said second end surface.

13. The optical semiconductor device as claimed in one of claims 1, 3, 5, wherein said upper cladding layer in said second area has a thickness gradually increasing toward said first end surface.

14. The optical semiconductor device as claimed in claim 7, wherein said first electrode is extended to a portion of said second area adjacent to said first area.

15. The optical semiconductor device as claimed in one of claims 1, 3, 5, wherein a thickness of each layer in said second area adjacent to said second end surface is uniform.

16. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having the second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer being provided between said core layer and said lower cladding layer;

the layered structure in said first area corresponding to a double hetero pin junction structure in which said core layer is an intrinsic layer;

a diffraction-grating type optical reflector being provided between said lower transmission constant reduction enhancing layer and said lower cladding layer in said first area, said diffraction-grating type optical reflector being formed as a boundary having a periodical unevenness; and a first electrode on a top surface of said optical semiconductor device in said first area and a second electrode on a bottom surface of said optical semiconductor device, a laser beam being generated in said core layer in said first area by supplying a current via said first electrode and said second electrode, the laser beam passing through said second area and exiting from said first end surface.

17. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having the second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer including a lower transmission constant reduction enhancing layer and an upper transmission constant reduction enhancing layer, said lower transmission constant reduction enhancing layer provided between said core layer and said lower cladding layer, said upper transmission constant reduction enhancing layer provided between said core layer and said upper cladding layer;

the layered structure in said first area corresponding to a double hetero pin junction structure in which said core layer is an intrinsic layer;

a diffraction-grating type optical reflector being provided between said lower transmission constant reduction enhancing layer and said lower cladding layer in said first area, said diffraction-grating type optical reflector being formed as a boundary having a periodical unevenness; and a first electrode being provided on a top surface of said optical semiconductor device in said first area and a second electrode being provided on a bottom surface of said optical semiconductor device, a laser beam being generated in said core layer in said first area by supplying a current via said first electrode and said second electrode, the laser beam passing through said second area and exiting from said first end surface.

18. The optical semiconductor device as claimed in claim 16, further comprising a secondary core layer provided between said transmission constant reduction enhancing layer and said lower cladding layer, said secondary core layer having a fourth refractive index less than said first refractive index and greater than said second refractive index.

19. The optical semiconductor device as claimed in claim 17, further comprising a secondary core layer provided between said lower transmission constant reduction enhancing layer and said lower cladding layer, said secondary core layer having a fourth refractive index less than said first refractive index and greater than said second refractive index.

20. The optical semiconductor device as claimed in one of claims 1 and 5, wherein the layered structure in said first area corresponds to a double hetero pin junction structure in which said core layer is an intrinsic layer;

a diffraction-grating type optical reflector being provided between said lower transmission constant reduction enhancing layer and said lower cladding layer in said first area, said diffraction-grating type optical reflector being formed as a boundary having a periodical unevenness; and a first electrode provided on a top surface of said optical semiconductor device in said first area and a second electrode provided on a bottom surface of said optical semiconductor device, a laser beam being generated in said core layer in said first area by supplying a current via said first electrode and said second electrode, the laser beam passing through said second area and exiting from said first end surface.

21. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having the second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer being provided between said core layer and said upper cladding layer;

the layered structure in said first area corresponding to a double hetero pin junction structure in which said core layer is an intrinsic layer;

a diffraction-grating type optical reflector being provided between said transmission constant reduction enhancing layer and said upper cladding layer in said first area, said diffraction-grating type optical reflector being formed as a boundary having a periodical unevenness; and a first electrode provided on a top surface of said optical semiconductor device in said first area and a second electrode provided on a bottom surface of said optical semiconductor device, a laser beam being generated in said core layer in said first area by supplying a current via said first electrode and said second electrode, the laser beam passing through said second area and exiting from said first end surface.

22. An optical semiconductor device having a multilayered structure and having a first end surface perpendicular to an optical axis of said optical semiconductor device and a second end surface opposite to said first end surface, said optical semiconductor device comprising:

a core layer having a first refractive index;

a lower cladding layer provided on a lower side of said core layer, said lower cladding layer having a second refractive index;

an upper cladding layer provided on an upper side of said core layer, said upper cladding layer having the second refractive index; and a transmission constant reduction enhancing layer provided between said lower cladding layer and said upper cladding layer, said transmission constant reduction enhancing layer having a third refractive index less than said first refractive index and said second refractive index, wherein said optical semiconductor device includes a first area and a second area, a portion of said core layer in said first area having a uniform thickness, a portion of said core layer in said second area having a thickness gradually decreasing toward said first end surface of said optical semiconductor device;

said transmission constant reduction enhancing layer including a lower transmission constant reduction enhancing layer and an upper transmission constant reduction enhancing layer, said lower transmission constant reduction enhancing layer provided between said core layer and said lower cladding layer, said upper transmission constant reduction enhancing layer provided between said core layer and said upper cladding layer;

the layered structure in said first area corresponding to a double hetero pin junction structure in which said core layer is an intrinsic layer;

a diffraction-grating type optical reflector being provided between said transmission constant reduction enhancing layer and said upper cladding layer in said first area, said diffraction-grating type optical reflector being formed as a boundary having a periodical unevenness; and a first electrode provided on a top surface of said optical semiconductor device in said first area and a second electrode provided on a bottom surface of said optical semiconductor device, a laser beam being generated in said core layer in said first area by supplying a current via said first electrode and said second electrode, the laser beam passing through said second area and exiting from said first end surface.

23. The optical semiconductor device as claimed in claim 21, further comprising a secondary core layer provided between said core layer and said lower cladding layer, said secondary core layer having a fourth refractive index less than said first refractive index and greater than said second refractive index.

24. The optical semiconductor device as claimed in claim 22, further comprising a secondary core layer provided between said lower transmission constant reduction enhancing layer and said lower cladding layer, said secondary core layer having a fourth refractive index less than said first refractive index and greater than said second refractive index.

25. The optical semiconductor device as claimed in one of claims 3, 5, wherein the layered structure in said first area corresponds to a double hereto pin junction structure in which said core layer is an intrinsic layer;

a diffraction-grating type optical reflector being provided between said transmission constant reduction enhancing layer and said upper cladding layer in said first area, said diffraction-grating type optical reflector being formed as a boundary having a periodical unevenness; and a first electrode provided on a top surface of said optical semiconductor device in said first area and a second electrode provided on a bottom surface of said optical semiconductor device, a laser beam being generated in said core layer in said first area by supplying a current via said first electrode and said second electrode, the laser beam passing through said second area and exiting from said first end surface.

26. The optical semiconductor device as claimed in one of claims 16, 17, wherein a third area is provided between said first area and said second area, said third area having a layered structure the same as that of said first and second areas, a third electrode being provided on a top surface in said third area and said second electrode being extended in said third area, the laser beam generated in said first area being modulated by an electric field generated by a voltage supplied across said third electrode and said second electrode in said third area before entering said second area.

27. The optical semiconductor device as claimed in one of claims 21, 22, wherein a third area is provided between said first area and said second area, said third area having a layered structure the same as that of said first and second areas, a third electrode being provided on a top surface in said third area and said second electrode being extended in said third area, the laser beam generated in said first area being modulated by an electric field generated by a voltage supplied across said third electrode and said second electrode in said third area before entering said second area.

28. The optical semiconductor device as claimed in one of claims 16, 17, further comprising a third area having the same structure as said second area, said third area provided on an opposite side with respect to said first area so that said second end surface corresponds to an end surface of said third area which is remote from said first area, the layered structure in said first area corresponding to a double hetero pin junction structure in which said core layer is an intrinsic layer, an optical reflector being provided on each of said first end surface and said second end surface, said diffraction grating type optical reflector being a ¼ wavelength shifted diffraction-grating so that said diffraction-grating type optical reflector has a wavelength dependency with respect to reflection and transmission of light, the first electrode being provided on a top surface and the second electrode being provided on a bottom surface in said first area, a laser beam being generated in said core layer in said first area by supplying a current via said first electrode and said second electrode, the laser beam exiting from each of said first end surface and said second end surface.

29. The optical semiconductor device as claimed in one of claims 21, 22, further comprising a third area having the same structure as said second area, said third area being provided on an opposite side with respect to said first area, said second end surface corresponding to an end surface of said third area which is remote from said first area, the layered structure in said first area corresponding to a double hetero pin junction structure in which said core layer is an intrinsic layer, an optical reflector being provided on each of said first end surface and said second end surface, said diffraction-grating type optical reflector being a ¼ wavelength shifted diffraction-grating, said diffraction-grating type optical reflector having a wavelength dependency with respect to reflection and transmission of light, the first electrode being provided on a top surface and the second electrode being provided on a bottom surface in said first area, a laser beam being generated in said core layer in said first area by supplying a current via said first electrode and said second electrode, the laser beam exiting from each of said first end surface and said second end surface.

* * * * *